US010878872B2

(12) United States Patent
Osborne et al.

(10) Patent No.: US 10,878,872 B2
(45) Date of Patent: Dec. 29, 2020

(54) RANDOM ACCESS MEMORY

(71) Applicant: TAIWAN SEMICONDUCTOR MANUFACTURING CO., LTD., Hsinchu (TW)

(72) Inventors: Randy Osborne, Beaverton, OR (US); Kevin Xiaoqiang Zhang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/590,165

(22) Filed: Oct. 1, 2019

(65) Prior Publication Data

US 2020/0135251 A1 Apr. 30, 2020

Related U.S. Application Data

(60) Provisional application No. 62/753,881, filed on Oct. 31, 2018.

(51) Int. Cl.
*G11C 11/00* (2006.01)
*G11C 11/16* (2006.01)
*G11C 13/00* (2006.01)

(52) U.S. Cl.
CPC ........ *G11C 11/1659* (2013.01); *G11C 11/161* (2013.01); *G11C 11/1655* (2013.01); *G11C 11/1657* (2013.01); *G11C 11/1673* (2013.01); *G11C 11/1675* (2013.01); *G11C 13/003* (2013.01); *G11C 13/004* (2013.01); *G11C 13/0004* (2013.01); *G11C 13/0026* (2013.01); *G11C 13/0028* (2013.01); *G11C 13/0069* (2013.01); *G11C 2013/0045* (2013.01); *G11C 2013/0078* (2013.01)

(58) Field of Classification Search
CPC ... G11C 11/00; G11C 11/1659; G11C 11/161; G11C 11/1655; G11C 11/1657; G11C 11/1673; G11C 13/004; G11C 13/0026; G11C 13/0028; G11C 13/003; G11C 13/0069; G11C 2013/0045; G11C 2013/0078
USPC ........................................................ 365/158
See application file for complete search history.

(56) References Cited

U.S. PATENT DOCUMENTS

| 9,767,915 B2 | 9/2017 | Chung | |
|---|---|---|---|
| 2003/0002321 A1* | 1/2003 | Chang | G11C 11/412 365/154 |
| 2003/0147275 A1* | 8/2003 | Chang | G11C 11/412 365/174 |
| 2006/0226459 A1* | 10/2006 | Oh | G11C 7/18 257/296 |

(Continued)

*Primary Examiner* — Harry W Byrne
(74) *Attorney, Agent, or Firm* — McDermott Will & Emery LLP

(57) ABSTRACT

A memory cell includes a memory cell stack, a first word line, a second word line, a bit line coupled to one end of the memory cell stack, a first unidirectional selector having one end coupled to another end of the memory cell stack and another end coupled to the first word line, and a second unidirectional selector having one end coupled to the another end of the memory cell stack and another end coupled to the second word line. Current flow directions of the first unidirectional selector and the second unidirectional selector are opposite to each other.

20 Claims, 18 Drawing Sheets

(56) References Cited

U.S. PATENT DOCUMENTS

2009/0291522 A1* 11/2009 Oh .................... H01L 27/24
  438/102
2010/0085799 A1* 4/2010 Cho .................... G11C 13/004
  365/148

* cited by examiner

RANDOM ACCESS MEMORY

RELATED APPLICATION

This application claims priority to U.S. Provisional Patent Application No. 62/753,881 filed on Oct. 31, 2018, the entire disclosures of which are incorporated herein by reference.

BACKGROUND

An MRAM offers comparable performance to volatile static random access memory (SRAM) and comparable density with lower power consumption to volatile dynamic random access memory (DRAM). Compared to non-volatile memory (NVM) flash memory, an MRAM offers much faster access times and suffers minimal degradation over time, whereas a flash memory can only be rewritten a limited number of times. An MRAM cell is formed by a magnetic tunneling junction (MTJ) comprising two ferromagnetic layers which are separated by a thin insulating barrier, and operates by tunneling of electrons between the two ferromagnetic layers through the insulating barrier.

Similarly, a resistive random-access memory (ReRAM or RRAM) is a type of non-volatile random-access memory that works by changing the resistance across a dielectric solid-state material.

Further, a phase change random access memory (PCRAM) is a non-volatile memory device making use of different resistive phases and heat induced phase transition between the phases of the phase change materials. A PCRAM is composed of many cells each of which functions independently. A PCRAM cell mainly includes a heater and a resistor which is a data storage element made mainly of a reversible phase change material to provide at least two dramatically different resistivity levels for logical "0" state and "1" state. To read a state (data) from the PCRAM cell, a sufficiently small current is applied to the phase change material without triggering the heater to generate heat. In this way, the resistivity of the phase change material can be measured and the states representing the resistivity levels, i.e. a "0" state for high resistivity or a "1" state for low resistivity can be read. To write a state (data) in the PCRAM cell, for example, to write a "1" state representing a low resistivity phase of the phase change material, a medium electric current is applied to the heater which generates heat for annealing the phase change material at a temperature above the crystallization temperature but below the melting temperature of the phase change material for a time period to achieve a crystalline phase. To write a "0" state representing a high resistivity phase of the phase change material, a very large electric current is applied to the heater to generate heat to melt the phase change material at a temperature higher than the melting temperature of the phase change material; and the electric current is abruptly cut off to lower the temperature to below the crystallization temperature of the phase change material to quench and stabilize the amorphous structure of phase change material so as to achieve the high-resistance logical "0" state. The very large electric current can be in a pulse form.

DETAILED DESCRIPTION

Figure 1:
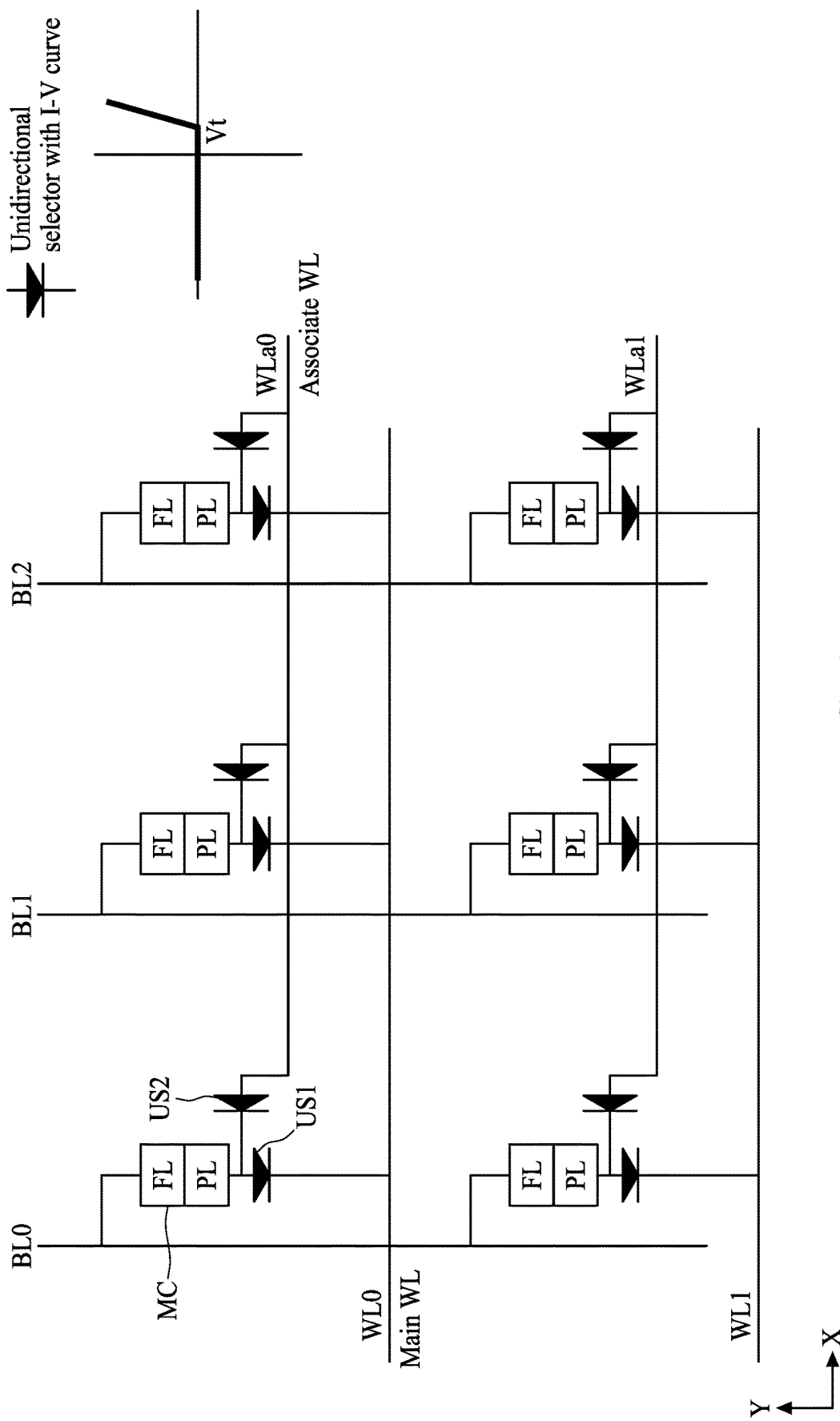
FIG. 1 is a circuit diagram of a MRAM cell array according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described.

Some embodiments of the present disclosure are directed to an MRAM including memory cells each having a MTJ film stack. In other embodiments, instead of an MRAM, a RRAM or a PCRAM can be utilized.

In a 1T1R MRAM configuration, each memory cell (MTJ bit cell) includes a selector transistor that controls when that bit cell is accessed. In advanced process nodes, the selector transistor will be larger than the MTJ bit cell and thereby limit the density of a memory array. Furthermore, the transistor area is proportional to fin pitch and/or metal gate pitch, and the scaling of these pitches is slowing down, limiting the density scaling. The MRAM array density can be improved by replacing the transistor selector with a two terminal selector. However, since the operation of MRAM MTJ bit cells requires a current to flow in both directions, the selector must be bidirectional. This complicates the selector. A two terminal selector in combination with a MTJ bit cell will meet a set of constraints between the selector threshold voltage and the MTJ cell voltage in order to minimize leakage via "sneak" paths.

In the present disclosure, to achieve a high density MRAM array, two unidirectional selectors (e.g., diodes) together with three terminals per unit cell are employed. Unidirectional selectors are simpler to manufacture in a back-end-of-line (BEOL) than bidirectional selectors or transistors. Three terminals per unit cell enables simultaneously writing of 0 and 1 to different bits along one word line.

FIG. 1 is a circuit diagram of a MRAM cell array according to an embodiment of the present disclosure. In this figure, "FL" refers to a first magnetic layer, as a free magnetic layer, and "PL" refers to a second magnetic layer, as a reference layer or a pinned layer, in an MTJ film stack. The MTJ film stack further includes other layers as explained below with respect to FIG. 11.

As shown in FIG. 1, two unidirectional selectors (diodes) are provided per one MTJ bit cell. Each unidirectional diode is connected to a respective word line: a main word line, denoted by WLx, and an associate word line, denoted by WLax, and thus includes 3 terminals per bit cell (x denotes an integer 0, 1, 2, 3, . . . ). The diodes are provided in opposite directions for WLx and WLax.

More specifically, a memory device in some embodiments of the present disclosure includes a plurality of memory cells arranged in a matrix, a plurality of main word lines extending in one direction (e.g., X direction) and arranged in parallel with each other in another direction (e.g., Y direction), a plurality of associate word lines extending in the X direction and arranged in parallel with each other in the Y direction, and a plurality of bit lines extending in the Y direction and arranged in parallel with each other in the X direction. As shown in FIG. 1, multiple cells (e.g., three cells) of the memory cell are coupled to one of the main word lines (e.g., WL0) and one of the associate word lines (e.g., WLa0). The number of memory cells coupled to the same word lines is not limited to three and can be more than 3, e.g., 4, 8, 16, 32, 64, 128, 256, 512 or 1024 or more. As shown in FIG. 1, each of the memory cells MC includes a memory cell stack. In some embodiments, the memory cell stack includes a MTJ film stack. The terminal (e.g., an electrode) located closer to the free layer FL is coupled to a corresponding one of the bit lines (e.g., BL0). Each of the memory cells further includes a first unidirectional selector (first diode) US1 and a second unidirectional selector (second diode) US2). The first diode has a first end (e.g., anode) coupled to another terminal (e.g., electrode) of the memory cell stack closer to the reference layer PL and a second end (e.g., cathode) coupled to one of the main word lines (e.g., WL0). The second unidirectional selector has a first end (e.g., cathode) coupled to another terminal of the memory cell stack and a second end (e.g., anode) coupled to one of the associated word lines (WLa0). As shown in FIG. 1, current flow directions of the first unidirectional selector and the second unidirectional selector are opposite to each other. In the following embodiments, the data "0" and "1" can be interchangeable.

In some embodiments, the main word lines are made of thicker and/or wider (i.e., lower resistance) conductive wires than the associate word lines, as long as the associate word lines can tolerate thinner metal for asymmetrical preset time—or can strap additional metal onto bottom of the associated word lines.

Figure 2:
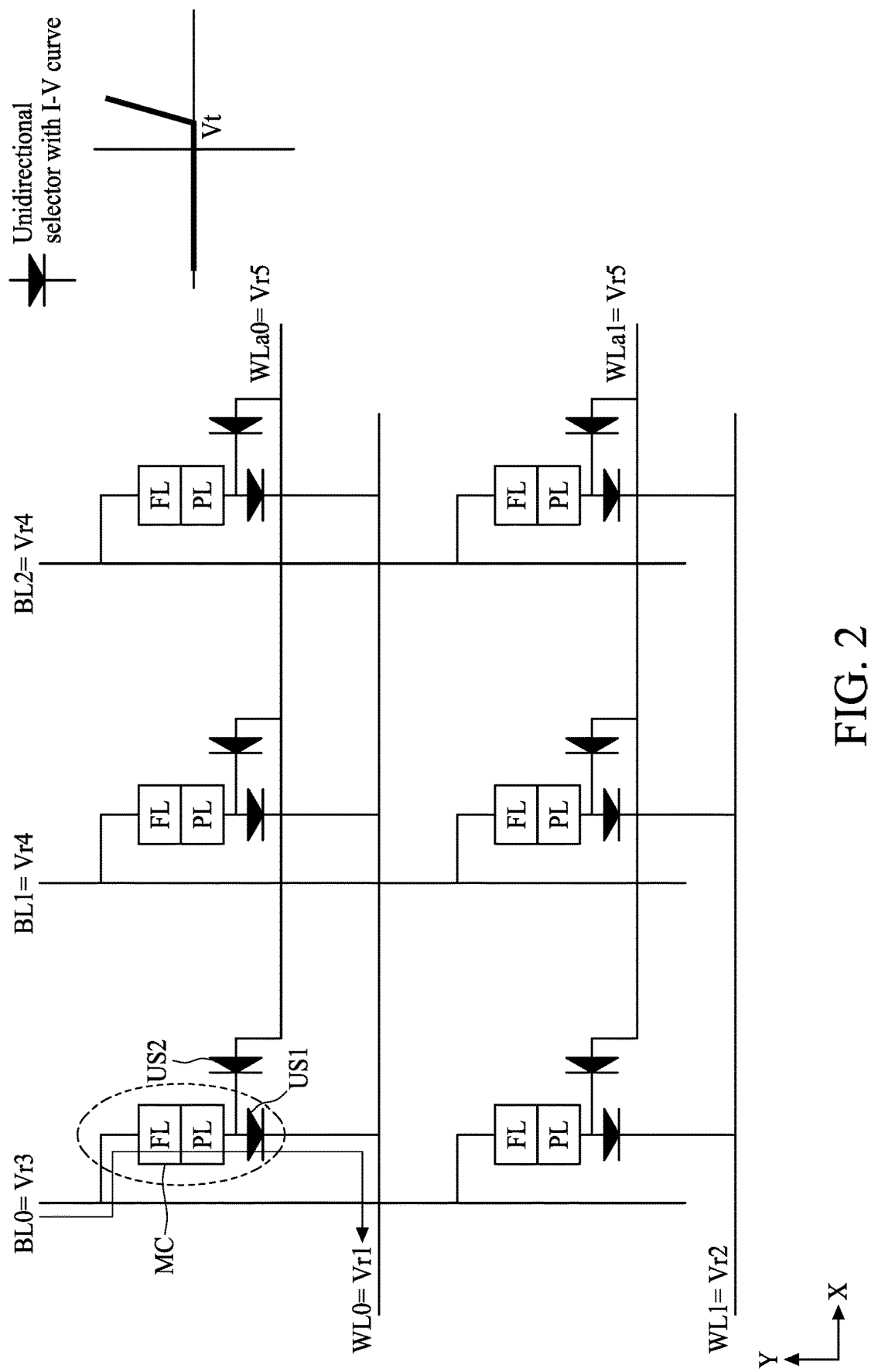
FIG. 2 shows a read operation for a MRAM array cell according to an embodiment of the present disclosure.

FIG. 2 shows a read operation for a MRAM cell according to an embodiment of the present disclosure. In reading data from a target memory cell MC, voltages are applied such that only the first diode US1 of the target memory cell MC is activated, while the remaining diodes are deactivated. In some embodiments, a first read voltage Vr1 is applied to a main word line WL0 coupled to the target memory cell MC, a second read voltage Vr2 is applied to remaining main word lines (e.g., WL1, . . . ) other than the main word line WL0, and a third read voltage Vr3 is applied to a bit line BL0 coupled to the target memory cell MC. In some embodiments, the voltage Vr2 is applied before the voltage Vr3 is applied to avoid memory cells coupled to the bit line BL0 other than the target memory cell MC are activated. The second read voltage Vr2 is higher than the first read voltage Vr1, and the third read voltage Vr3 is higher than the first read voltage Vr1. Thus, a read current flows through the target memory cell MC and the first diode US1 from the bit line BL0. In some embodiments, the voltage Vr1 is the ground voltage (0 V). The voltage Vr3 is higher than a threshold voltage of the first diode US1 (Vt), and in some embodiments, the voltage Vr3 is Vt+50 mV to 200 mV. The amount of voltage (e.g., 50-200 mV) may change depending on memory cell materials and/or structures, and is not limited to this range. In some embodiments, the voltage Vr2 is equal to or higher than the voltage Vr3. For the remaining bit lines, a fourth read voltage Vr4 is applied. In some embodiments, the voltage Vr4 is equal to or lower than the voltage Vr1. For the associate word lines WLa0, WLa1, . . . , a fifth read voltage Vr5 is applied. In some embodiments, the voltage Vr5 is equal to or lower than the voltage Vr4. In some embodiments, Vr4-Vr5 is equal to or lower than a threshold voltage of the second diode US2 (Vt). In certain embodiments, Vr2=Vr3=Vt+(50 to 200) mV and Vr1=Vr4=Vr5=0V.

Figure 3:
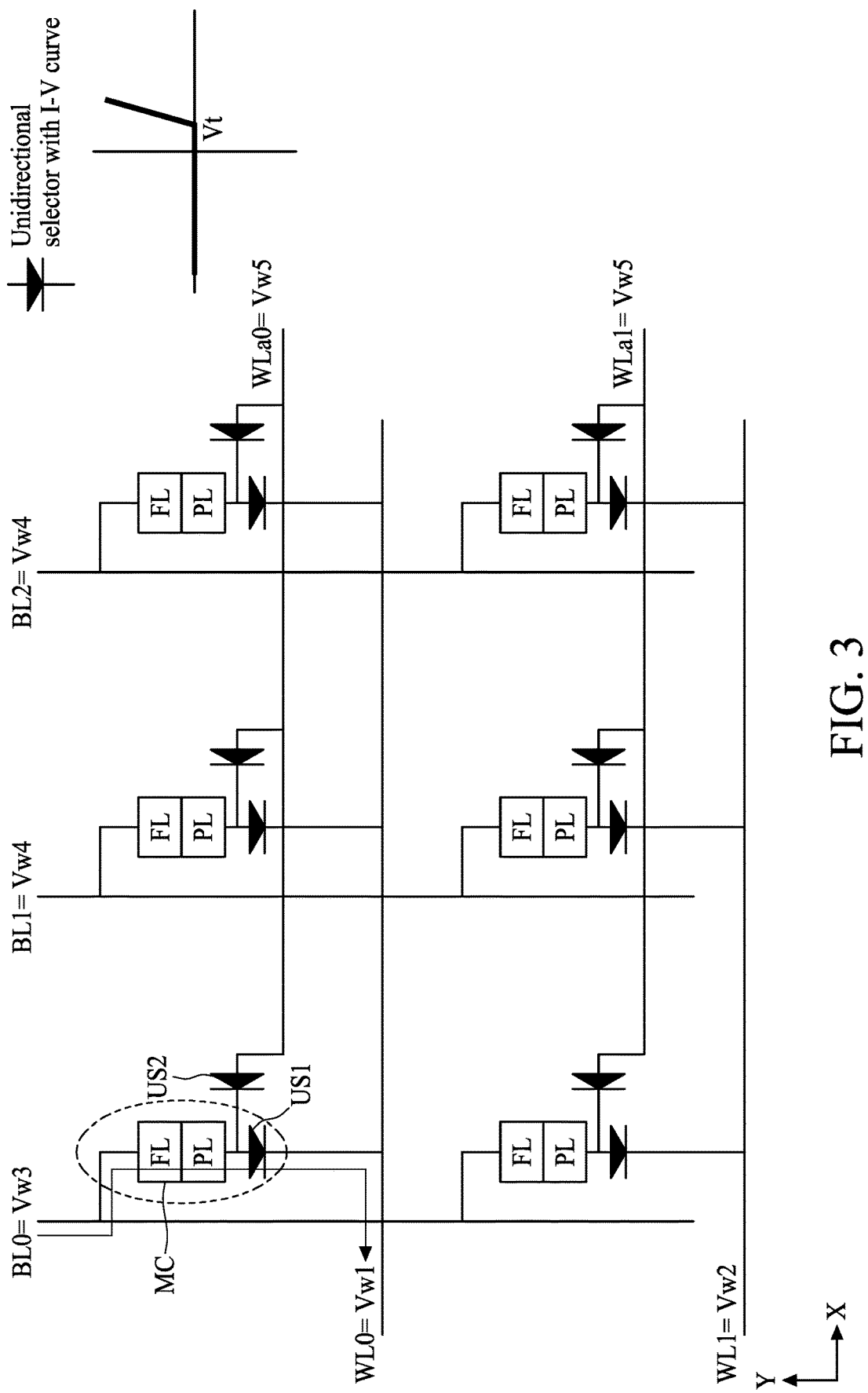
FIG. 3 shows a write operation for a MRAM array cell according to an embodiment of the present disclosure.

FIG. 3 shows a write operation for a MRAM cell according to an embodiment of the present disclosure. In writing first type data, e.g., "0", to a target memory cell MC, voltages are applied such that only the first diode US1 of the target memory cell MC is activated, while the remaining diodes are deactivated. In some embodiments, a first write voltage Vw1 is applied to a main word line WL0 coupled to the target memory cell MC, a second write voltage Vw2 is applied to remaining main word lines (e.g., WL1, . . . ) other than the main word line WL0, and a third write voltage Vw3 is applied to a bit line BL0 coupled to the target memory cell MC. In some embodiments, the voltage Vw2 is applied before the voltage Vw3 is applied. The second write voltage Vw2 is higher than the first write voltage Vw1, and the third write voltage Vw3 is higher than the first write voltage Vw1. Thus, a write current flows through the target memory cell MC and the first diode US1 from the bit line BL0. In some embodiments, the voltage Vw1 is the ground voltage (0 V). The voltage Vw3 is higher than a threshold voltage of the first diode (Vt), and in some embodiments, the voltage Vw3 is higher than Vr3 and is Vt+700 mV to 1000 mV. In some embodiments, the voltage Vw2 is equal to or higher than the voltage Vw3. For the remaining bit lines BL1, Bl2, . . . , a fourth write voltage Vw4 is applied. In some embodiments, the voltage Vw4 is equal to or lower than the voltage Vw1. For the associate word lines, a fifth write voltage Vw5 is applied. In some embodiments, the voltage Vw5 is equal to or lower than the voltage Vw4. In some embodiments, Vw4-Vw5 is equal to or lower than a threshold voltage of the second diode US2 (Vt). In certain embodiments, Vw2=Vw3=Vt+(700 to 1000) mV and Vw1=Vw4=Vw5=0V. In some embodiments, the third write voltage Vw3 is applied to the bit lines coupled to two or more memory cells to write data "0" simultaneously.

Figure 4:
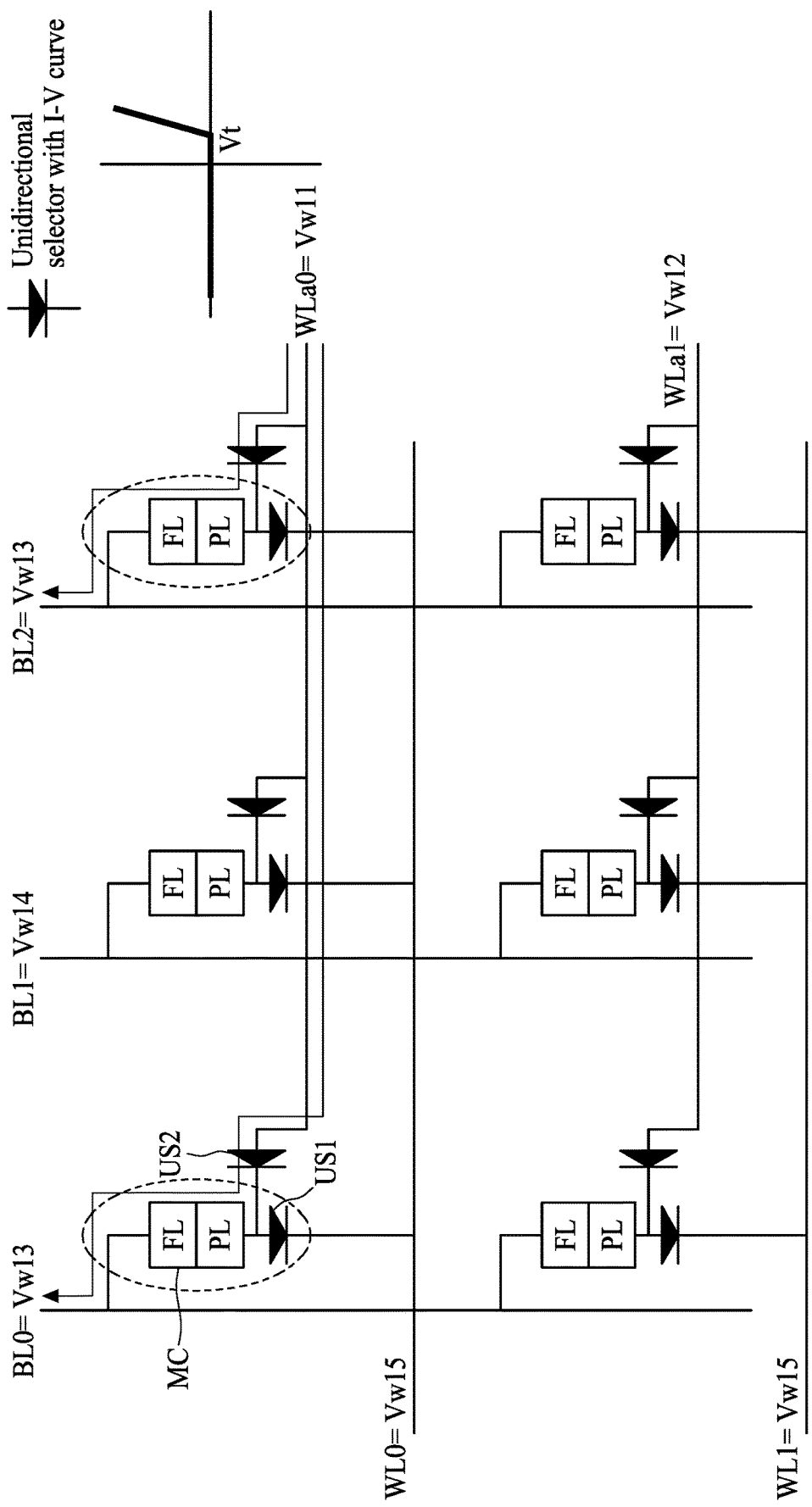
FIG. 4 shows a write operation for a MRAM array cell according to an embodiment of the present disclosure.

FIG. 4 shows a write operation for a MRAM cell according to another embodiment of the present disclosure. In writing second type data, e.g., "1", to a target memory cell MC, voltages are applied such that the second diode US2 coupled to the target memory cell MC is activated (turned on), while the remaining diodes are deactivated (turned off). In some embodiments, a first write voltage Vw11 is applied to an associate word line WLa0, a second write voltage Vw12 is applied to the remaining associate word lines WLa1, . . . , other than the associate word line WLa0, and a third write voltage Vw13 is applied to a bit line BL0 coupled to the target memory cell MC. In some embodiments, the Vw12 is applied before Vw11 and Vw13 are applied. The second write voltage Vw12 is lower than the first write voltage Vw11, and the third write voltage Vw13 is lower than the first write voltage Vw11. Thus, a write current flows through the target memory cell MC from the first associated world line via the second diode US2. In some embodiments, the voltage Vw11 is higher than a threshold voltage of the second diode (Vt), and in some embodiments, voltage Vw11 is Vt+700 mV to 1000 mV. In some embodiments, voltage Vw12 is the ground voltage (0 V). In some embodiments, voltage Vw12 is equal to or lower than voltage Vw13. For the remaining bit lines BL1, . . . , a fourth write voltage Vw14 is applied. In some embodiments, voltage Vw14 is equal to or higher than voltage Vw11. For the main word lines, a fifth write voltage Vw15 is applied. In some embodiments, Vw15 is equal to or higher than Vw14. In certain embodiments, Vw11=Vw15=Vt+(700 to 1000) mV and Vw12=Vw13=Vw14=0V. In some embodiments, as shown in FIG. 4, the third write voltage Vw13 is applied to two or more memory cells to write data "1" to two or more cells simultaneously.

Figure 5:
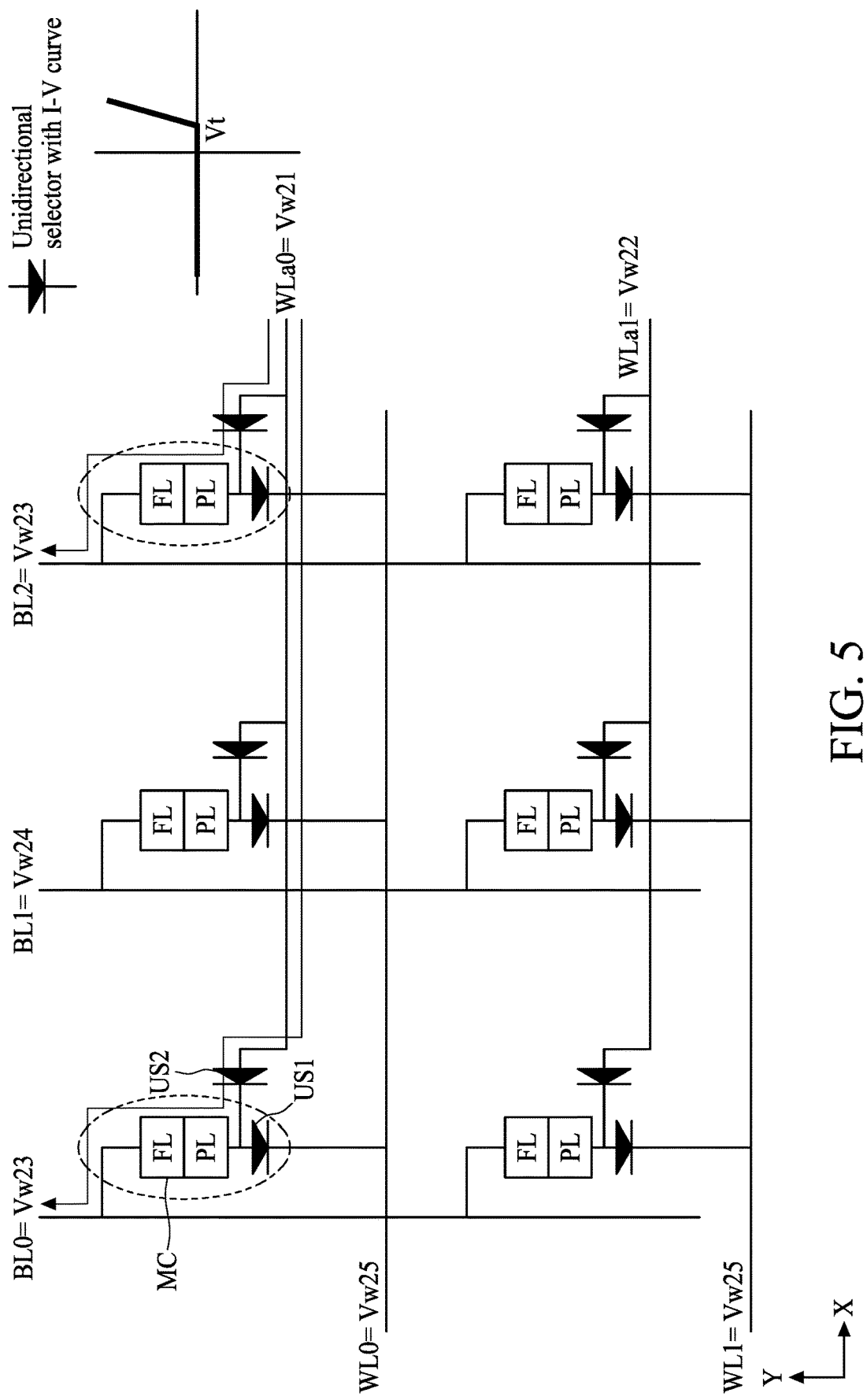
FIG. 5 shows a write operation for a MRAM array cell according to an embodiment of the present disclosure.

FIG. 5 shows a write operation for a MRAM cell according to another embodiment of the present disclosure. In writing second type data, e.g., "1", to a target memory cell MC, voltages are applied such that the second diode US2 coupled to the target memory cell MC is activated (turned on), while the remaining diodes are deactivated (turned off). In some embodiments, a first write voltage Vw21 is applied to an associate word line WLa0, a second write voltage Vw22 is applied to remaining associate word lines WLa1, . . . , other than the associate word line WLa0, and a third write voltage Vw23 is applied to a bit line BL0 coupled to the target memory cell MC. In some embodiments, the Vw22 is applied before Vw21 and Vw23 are applied. The second write voltage Vw22 is lower than the first write voltage Vw21, and the third write voltage Vw23 is lower than the first write voltage Vw21. Thus, a write current flows through the target memory cell MC from the first associated world line via the second diode US2. In some embodiments, Vw21 is the ground voltage (0 V). In some embodiments, the second voltage Vw 22 is lower than a threshold voltage of the second diode (Vt), and in some embodiments, Vw22 is -(Vt+700 mV to 1000 mV). In some embodiments, the voltage Vw22 is equal to or lower than the voltage Vw23. For the remaining bit lines BL1, BL2, . . . , a fourth write voltage Vw24 is applied. In some embodiments, the voltage Vw24 is equal to or higher than the voltage Vw22. For the main word lines, a fifth write voltage Vw25 is applied. In some embodiments, the voltage Vw25 is equal to or higher than the voltage Vw24. In certain embodiments, Vw21=Vw24=0V, Vw22=Vw23=-(Vt+700 to 1000 mV) and Vw25=Vt+(700 to 1000) mV. In some embodiments, as shown in FIG. 5, the third write voltage Vw23 is applied to bit lines BL0 and BL2 coupled to two or more memory cells MC to write data "1" simultaneously.

Figure 6:
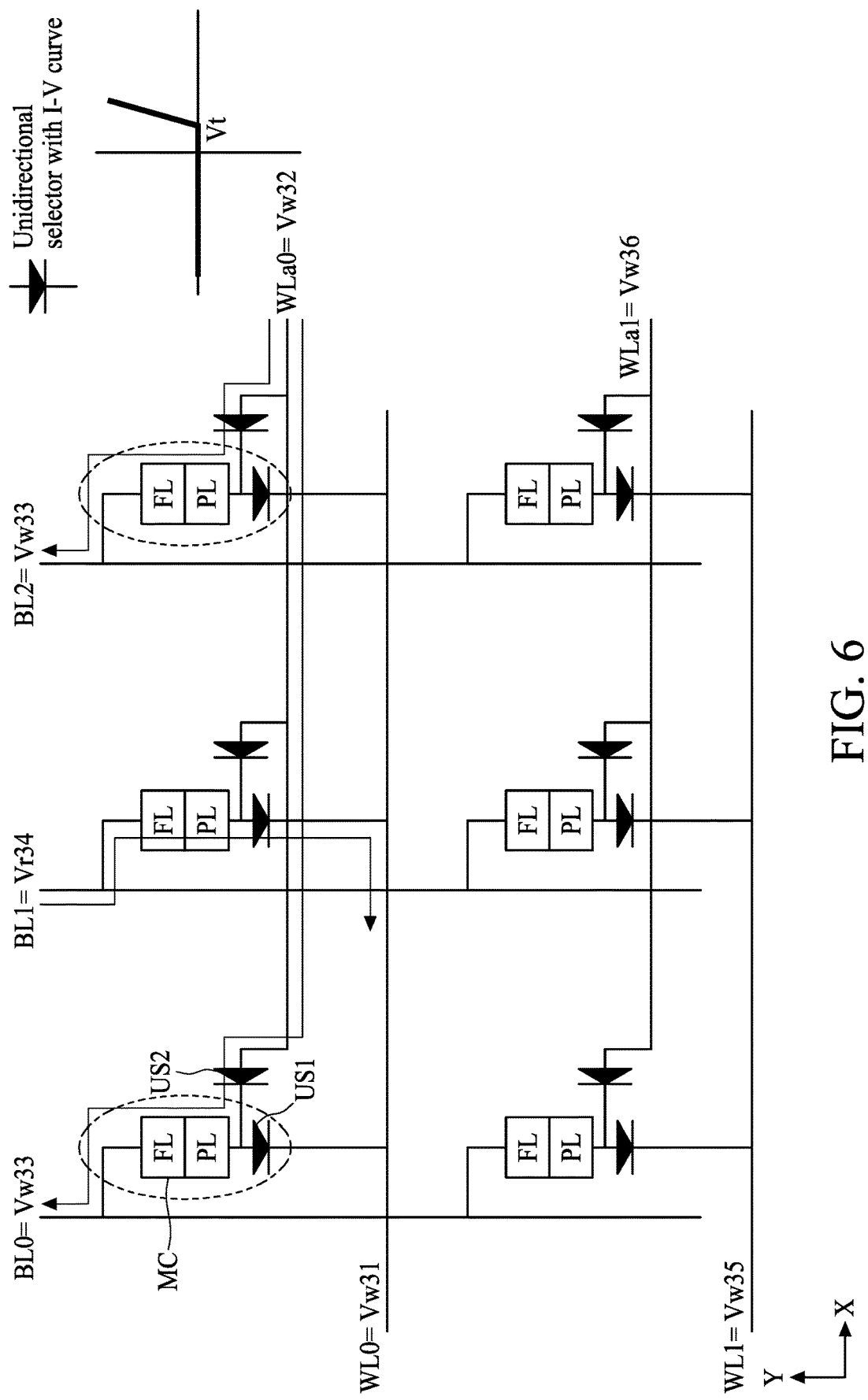
FIG. 6 shows a write operation for a MRAM cell array according to an embodiment of the present disclosure.

FIG. 6 shows a write operation for a MRAM cell according to another embodiment of the present disclosure. In this embodiments, data "0" and data "1" are simultaneously written in two or more memory cells MC, e.g., writing data "1" to a first target memory cell MC coupled to a bit line BL0 and word lines WL0 and WLa0 and data "0" to a second target memory cell MC coupled to a bit line BL1 and the word lines WL0 and WLa0. In some embodiments, voltages are applied such that the second diode US2 of the first target memory cell MC is activated (turned on) to write data "1" via the associate word line WLa0, and the first diode US1 of the second target memory cell MC is activated (turned on) to write data "0" via the main word line WL0, while remaining first and second diodes are deactivated (turned off).

In some embodiments, a first write voltage Vw31 is applied to the main word line WL0, a second write voltage Vw32 is applied to the associate word line WLa0, a third write voltage Vw33 is applied to the bit line BL0 coupled to the first target memory cell MC, and a fourth write voltage Vw34 is applied to the bit line BL1 coupled to the second target memory cell MC, while a fifth write voltage Vw35 is applied to remaining main word lines WL1, . . . , and a sixth write voltage Vw36 is applied to remaining associate word lines WLa1, . . . . In some embodiments, the first write voltage Vw31 is lower than the fourth write voltage Vw34 so that a write current flows through the second target memory cell MC from the bit line BL1, and the second write voltage Vw32 is higher than the third write voltage Vw33 so that a write current flows through the first target memory cell MC from the associate word line WLa0. In some embodiments, the fifth write voltage Vw35 is higher than the first write voltage Vw31, and is equal to or higher than the third write voltage Vw33. In some embodiments, the sixth write voltage Vw36 is lower than the second write voltage Vw32 and is equal to or higher than the fourth write voltage Vw34.

In certain embodiments, Vw31=Vw32=0V, Vw33=Vw36=−(Vt+700 to 1000 mV), and Vw34=Vw35=Vt+(700 to 1000) mV.

Figure 7:
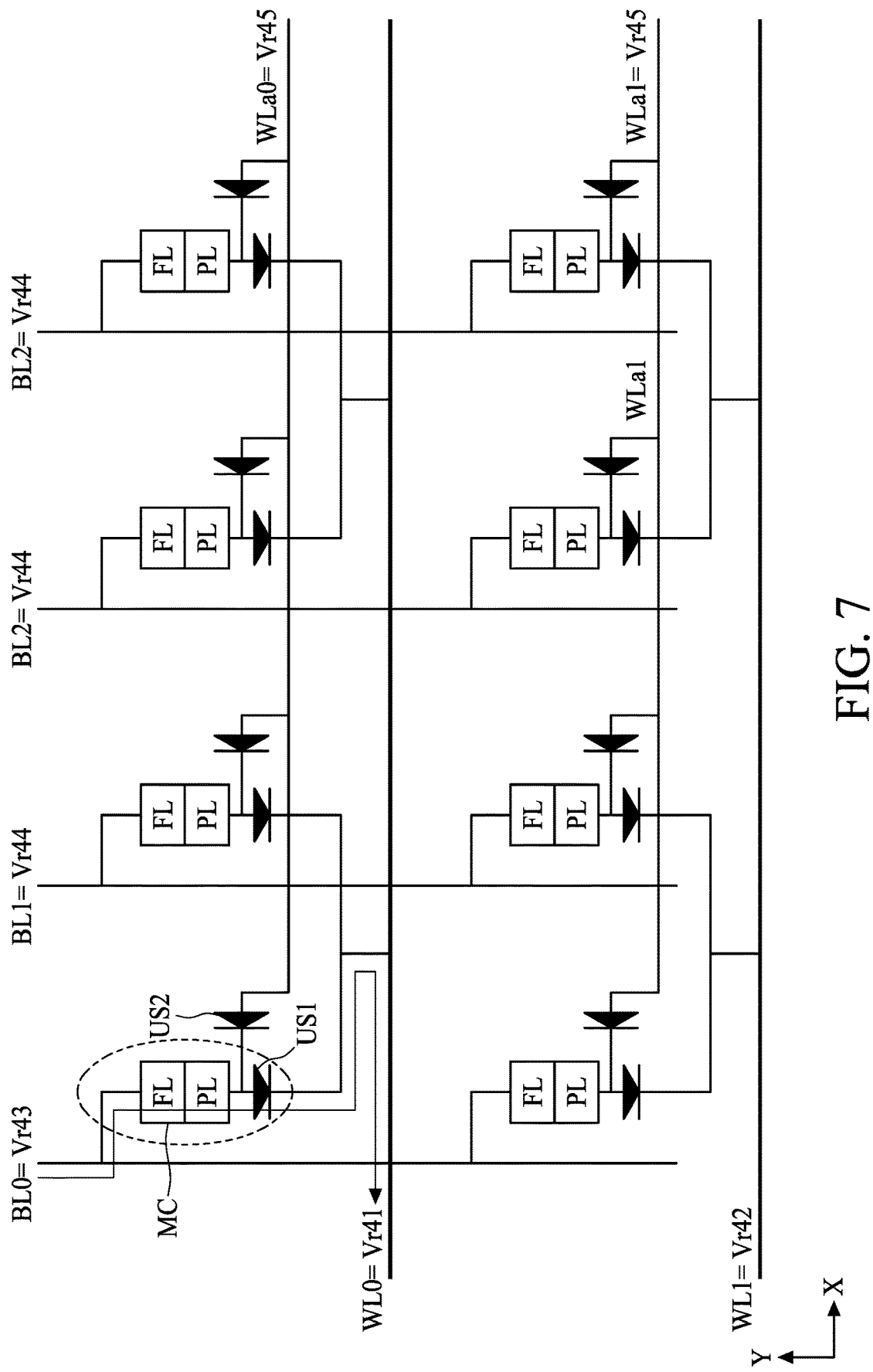
FIG. 7 shows a circuit diagram and a read operation for a MRAM cell array according to another embodiment of the present disclosure.

FIG. 7 shows a circuit diagram and a read operation for a MRAM cell according to another embodiment of the present disclosure. In this configuration, sub-word lines are coupled to two or more memory cells, respectively, and are coupled to a main word line.

In reading data from a target memory cell MC, voltages are applied such that only the first diode US1 of the target memory cell MC is activated, while the remaining diodes are deactivated. In some embodiments, a first read voltage Vr41 is applied to a main word line WL0 coupled to the target memory cell MC, a second read voltage Vr42 is applied to remaining main word lines (e.g., WL1, . . . ) other than the main word line WL0, and a third read voltage Vr43 is applied to a bit line BL0 coupled to the target memory cell MC. In some embodiments, the voltage Vr42 is applied before the voltage Vr43 is applied. The second read voltage Vr42 is higher than the first read voltage Vr41, and the third read voltage Vr43 is higher than the first read voltage Vr41. Thus, a read current flows through the target memory cell MC and the first diode US1 from the bit line BL0. In some embodiments, the voltage Vr41 is the ground voltage (0 V). The voltage Vr43 is higher than a threshold voltage of the first diode US1 (Vt), and in some embodiments, the voltage Vr43 is Vt+50 mV to 200 mV. In some embodiments, the voltage Vr42 is equal to or higher than the voltage Vr43. For the remaining bit lines, a fourth read voltage Vr44 is applied. In some embodiments, the voltage Vr44 is equal to or lower than the voltage Vr41. For the associate word lines WLa0, WLa1, . . . , a fifth read voltage Vr45 is applied. In some embodiments, the voltage Vr45 is equal to or lower than the voltage Vr44. In some embodiments, Vr44-Vr45 is equal to or lower than a threshold voltage of the second diode US2 (Vt). In certain embodiments, Vr42=Vr43=Vt+(50 to 200) mV and Vr41=Vr44=Vr45=0V.

Figure 8:
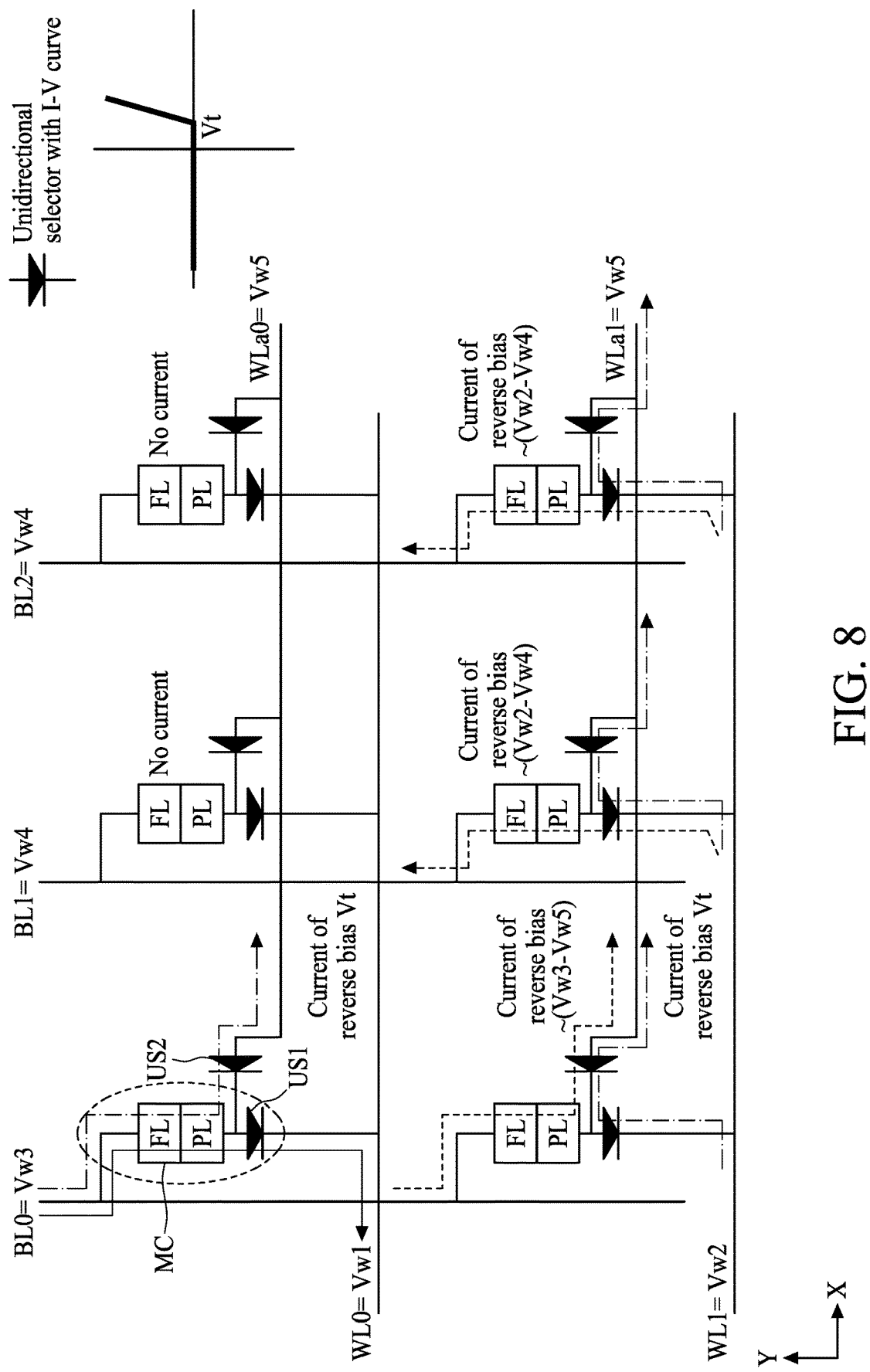
FIG. 8 shows a write operation for a MRAM cell array according to an embodiment of the present disclosure.
Figure 9:
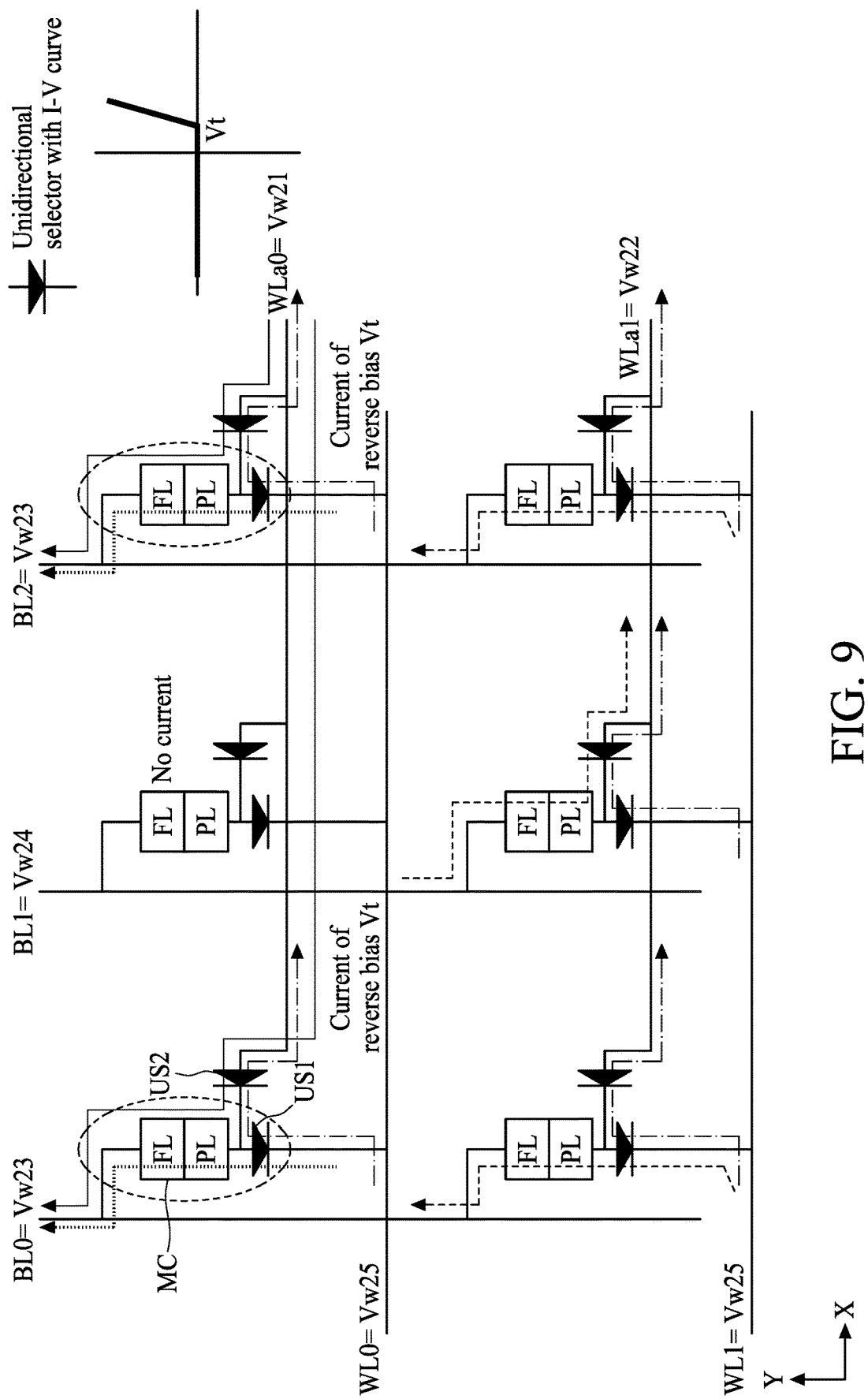
FIG. 9 shows a write operation for a MRAM cell array according to an embodiment of the present disclosure.

FIGS. 8 and 9 show write operations for a MRAM cell according to an embodiment of the present disclosure. FIG. 8 illustrates a back current issue in the configuration of the present embodiments, when writing data "0" and FIG. 9 illustrates a back current issue in the configuration of the present embodiments, when writing data "1".

In FIG. 8, applied voltages to the word lines and bit lines are the same as those in FIG. 3 in some embodiments. In FIG. 9, applied voltages to the word lines and bit lines are the same as those in FIG. 5 in some embodiments. In FIG. 8, assuming that the reverse bias resistance is sufficiently larger than the resistance of the memory cell MC and the voltages are applied as shown in FIG. 8, reverse bias current may flow as shown by broken line arrows. However, the amount of the reverse bias current is sufficiently small and does not cause major problems other than a small power loss. Similarly, in FIG. 9, assuming that the reverse bias resistance is sufficiently larger than the resistance of the memory cell MC and the voltages are applied as shown in FIG. 8, the reverse bias current may flow as shown by broken line arrows. However, the amount of the reverse bias current is sufficiently small and does not cause major problems other than a small power loss.

Figure 10:
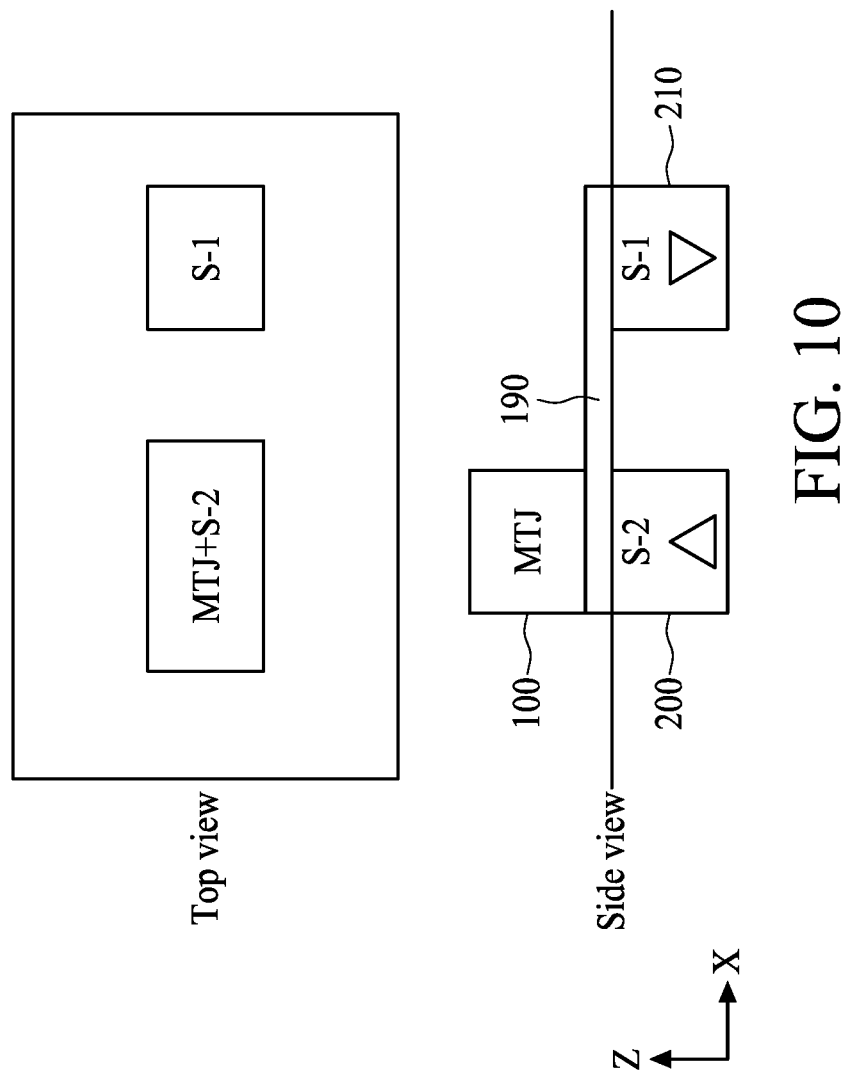
FIG. 10 shows a structural configuration of a MRAM cell according to an embodiment of the present disclosure.

FIG. 10 shows a structural configuration of a MRAM cell according to an embodiment of the present disclosure. In some embodiments, one of the diodes 200 is located just below the MTJ film stack 100 and another of the diodes 200 is located horizontally away from the one of the diodes. The diode 200 and the MTJ film stack are coupled by a metal film 190, in some embodiments.

Figure 11B:
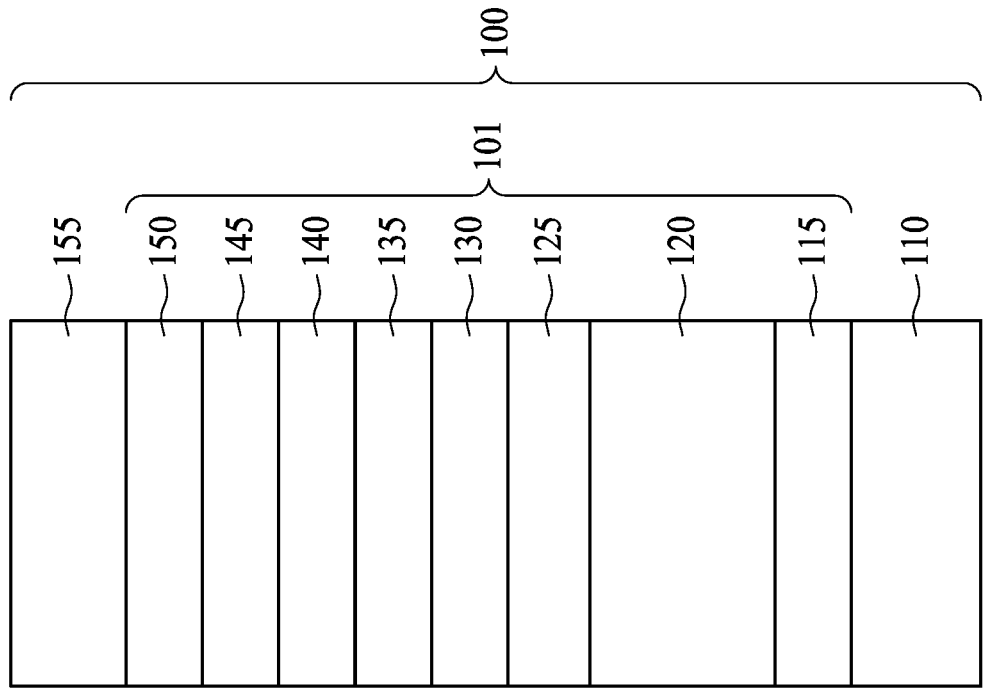
FIGS. 11A and 11B show cross sectional views of an MTJ film stack according to an embodiment of the present disclosure.
Figure 11A:
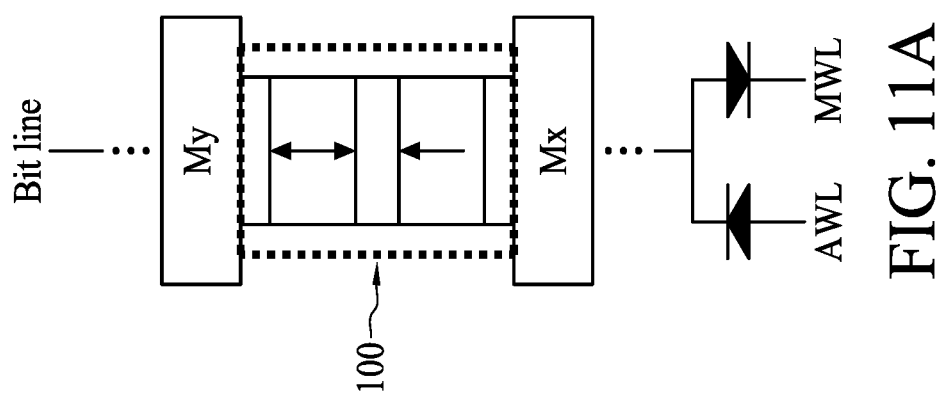
Figure 12C:
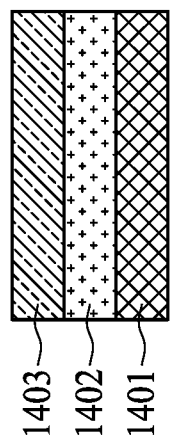
FIGS. 12A, 12B and 12C show schematic cross sectional views of magnetic layers of the MTJ film stack according to an embodiment of the present disclosure.
Figure 12B:
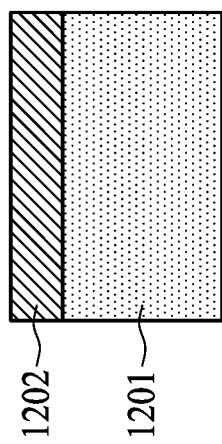
Figure 12A:
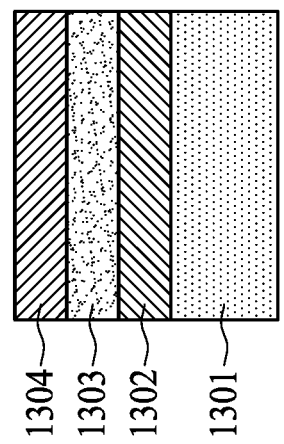

FIGS. 11A and 11B show cross sectional views of an MTJ film stack according to an embodiment of the present disclosure. FIGS. 12A, 12B and 12C show schematic cross sectional views of magnetic layers of the MTJ film stack according to an embodiment of the present disclosure.

FIG. 11A is a schematic view of a MTJ MRAM cell according to an embodiment of the present disclosure. The MTJ film stack 100 is disposed between a lower metal layer Mx and an upper metal layer My of a semiconductor device. The metal layers Mx and My are used to connect one element to another element in a semiconductor device formed at a different level above a substrate. Further, the lower metal layer Mx is coupled to unidirectional selectors (diodes), which are coupled to an associate word line AWL and a main word line MWL, respectively. The upper metal layer My is coupled to a bit line.

The MTJ film stack 100 includes a first electrode layer 110 coupled to the lower metal layer Mx and a second electrode layer 155 coupled to the upper metal layer My. An MTJ functional layer 101 is disposed between the first electrode layer 110 and the second electrode layer 155, as shown in FIG. 11B.

The MTJ functional layer 101 includes a second pinned magnetic layer 130, a free magnetic layer 140, and a tunneling barrier layer 135 made of a non-magnetic material and disposed between the second pinned magnetic layer 130 and the free magnetic layer 140. The free magnetic layer 140 and the second pinned magnetic layer 130 include one or more ferromagnetic materials that can be magnetically oriented, respectively. The free magnetic layer 140 is configured such that the magnetic orientation can be changed, or rotated, by exposure to an external magnetic field. The second pinned magnetic layer 130 is configured such that the magnetic orientation is fixed and will not respond to a typical magnetic field. In some embodiments, the thickness of the free magnetic layer 140 is in a range from about 0.8 nm to about 1.5 nm. In some embodiments, the thickness of the second pinned layer 130 is in a range from about 0.8 nm to about 2.0 nm.

The tunneling barrier layer 135 includes a relatively thin oxide layer capable of electrically isolating the free magnetic layer 140 from the second pinned magnetic layer 130 at low potentials and capable of conducting current through electron tunneling at higher potentials. In some embodiments, the tunneling barrier layer 135 is made of magnesium oxide (MgO) having a thickness in a range from about 0.5 nm to about 1.2 nm.

The MTJ functional layer 101 further includes an antiferromagnetic layer 125, as shown in FIG. 11B. The antiferromagnetic layer 125 is used to fix the magnetic orientation of the second pinned magnetic layer 130. The antiferromagnetic layer 125 includes ruthenium (Ru) or any other suitable antiferromagnetic material. In some embodiments, the thickness of the antiferromagnetic layer 125 is in a range from about 0.4 nm to about 1.0 nm.

The MTJ functional layer 101 further includes a first pinned magnetic layer 120 including one or more magnetic materials, as shown in FIG. 11B.

The second pinned magnetic layer 130 includes multiple layers of magnetic materials. In some embodiments, as shown in FIG. 12A, the second pinned magnetic layer 130 includes four layers 1301, 1302, 1303 and 1304, where the layer 1304 is in contact with the tunneling barrier layer 135 and the layer 1301 is in contact with the antiferromagnetic layer 125. In some embodiments, the layer 1301 (the bottommost layer) includes a multilayer structure of cobalt (Co) and platinum (Pt). In some embodiments, a thickness of the cobalt layer is in a range from about 0.3 nm to about 0.6 nm and a thickness of the platinum layer is in a range from about 0.2 nm to about 0.5 nm. The thickness of the cobalt layer can be the same as or greater than the platinum layer. The cobalt layers and the platinum layers are alternately stacked such that the total thickness of the layer 1301 is in a range from about 2.0 nm to about 5.0 nm in some embodiments. The layer 1302 includes a cobalt layer having a thickness in a range from about 0.4 nm to about 0.6 nm. In certain embodiments, the layer 1301 is the cobalt layer and the layer 1302 is the multilayer of the cobalt layers and the platinum layers as set forth above. In this disclosure, an "element" layer generally means that the content of the "element" is more than 99%.

The layer 1303 is a spacer layer. The thickness of the spacer layer 1303 is in a range from about 0.2 nm to about 0.5 nm in some embodiments. The layer 1304 is a cobalt iron boron (CoFeB) layer, a cobalt/palladium (CoPd) layer and/or a cobalt iron (CoFe) layer. The thickness of the layer 1304 is in a range from about 0.8 nm to about 1.5 nm in some embodiments.

The first pinned magnetic layer 120 includes multiple layers of magnetic materials. In some embodiments, as shown in FIG. 12B, the first pinned magnetic layer 120 includes two layers 1201 and 1202, where the layer 1202 is in contact with the antiferromagnetic layer 125. In some embodiments, the layer 1201 includes a multilayer structure of cobalt (Co) and platinum (Pt). In some embodiments, a thickness of the cobalt layer is in a range from about 0.3 nm to about 0.6 nm and a thickness of the platinum layer is in a range from about 0.2 nm to about 0.5 nm. The thickness of the cobalt layer can be the same as or greater than the platinum layer. The cobalt layers and the platinum layers are alternately stacked such that the total thickness of the layer 1201 is in a range from about 5.0 nm to about 10.0 nm in some embodiments. The layer 1202 includes a cobalt layer having a thickness in a range from about 0.4 nm to about 0.6 nm.

The free magnetic layer 140 includes a cobalt iron boron (CoFeB) layer, a cobalt/palladium (CoPd) layer and/or a cobalt iron (CoFe) layer having a thickness in a range from about 1.0 nm to about 2.0 nm in some embodiments. In other embodiments, the free magnetic layer 140 includes multiple layers of magnetic materials. In some embodiments, as shown in FIG. 12C, the free magnetic layer 140 includes three layers 1401, 1402 and 1403, where the layer 1401 is in contact with the tunneling barrier layer 135. The layers 1401 and 1403 are a cobalt iron boron (CoFeB) layer, a cobalt/palladium (CoPd) layer and/or a cobalt iron (CoFe) layer having a thickness is in a range from about 1.0 nm to about 2.0 nm in some embodiments. The layer 1402 is a spacer layer. The thickness of the spacer layer 1402 is in a range from about 0.2 nm to about 0.6 nm in some embodiments.

The MTJ functional layer 101 further includes a seed layer 115 formed on the first electrode layer 110, a capping layer 145 formed on the free magnetic layer 140, and a diffusion barrier layer 150 formed on the capping layer 145, as shown in FIG. 11B. The capping layer 145 is made of a dielectric material, such as magnesium oxide or aluminum oxide, and has a thickness in a range from about 0.5 nm to about 1.5 nm in some embodiments. The first electrode layer 110 is made of a conductive material, such as a metal, to reduce the resistance of the first pinned magnetic layer 120, especially for programming. The second electrode layer 155 is also made of a conductive material, such as a metal, to reduce the resistivity during reading.

Figure 13:
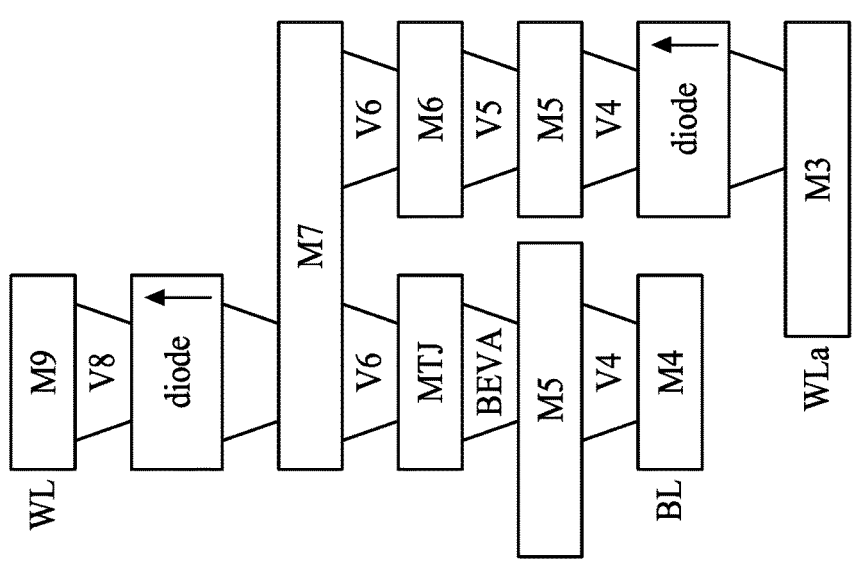
FIG. 13 show a schematic cross sectional view of the MRAM cell according to an embodiment of the present disclosure.

FIG. 13 is a schematic cross sectional view of the MRAM cell according to an embodiment of the present disclosure. In FIGS. 13-17, "Mx" (x=0, 1, 2, 3, . . . ) refers to a metal wiring layer at respective levels disposed over a substrate, and "Vy" (y=0, 1, 2, 3, . . . ) refers to a via (contact) connecting the My metal wiring layer to the My+1 metal wiring layer. In some embodiments, the even-number metal wiring layers extend in one direction and the odd-numbered metal wiring layers extend in another direction crossing the one direction. In some embodiments, pitches for metal wirings in M3 and M4 are the same and pitches for the metal wirings in M5 or higher are the same and are larger than the pitches for the metal wirings in M3 and M4.

In some embodiments, the MTJ film stack MTJ is disposed between M5 layer and M7 layer, one of the diodes is disposed below the MTJ film stack MTJ between M3 layer and M5 layer and the other of the diodes is disposed above the MTJ film stack between the M7 layer and M9 layer. In some embodiments, the main word line WL is disposed at M9 layer and the associate word line WLa is disposed at the M3 layer. In some embodiments, the bit line BL is disposed at the M4 layer. In other embodiments, the main word line WL is disposed at M3 layer and the associate word line WLa is disposed at the M3 layer. In some embodiments, the MTJ film stack MTJ is disposed over a bottom electrode via contact BEVA disposed over the M4 layer. Similarly, the diodes are disposed over bottom electrode via contacts. In some embodiments, the diodes are disposed in different wiring layers (e.g., one is higher wiring layer and the other is lower wiring layer than the MTJ) and have the same current flow direction as shown in FIG. 13, which makes manufacturing process simpler than fabricating diodes having different current flow directions.

Figure 14:
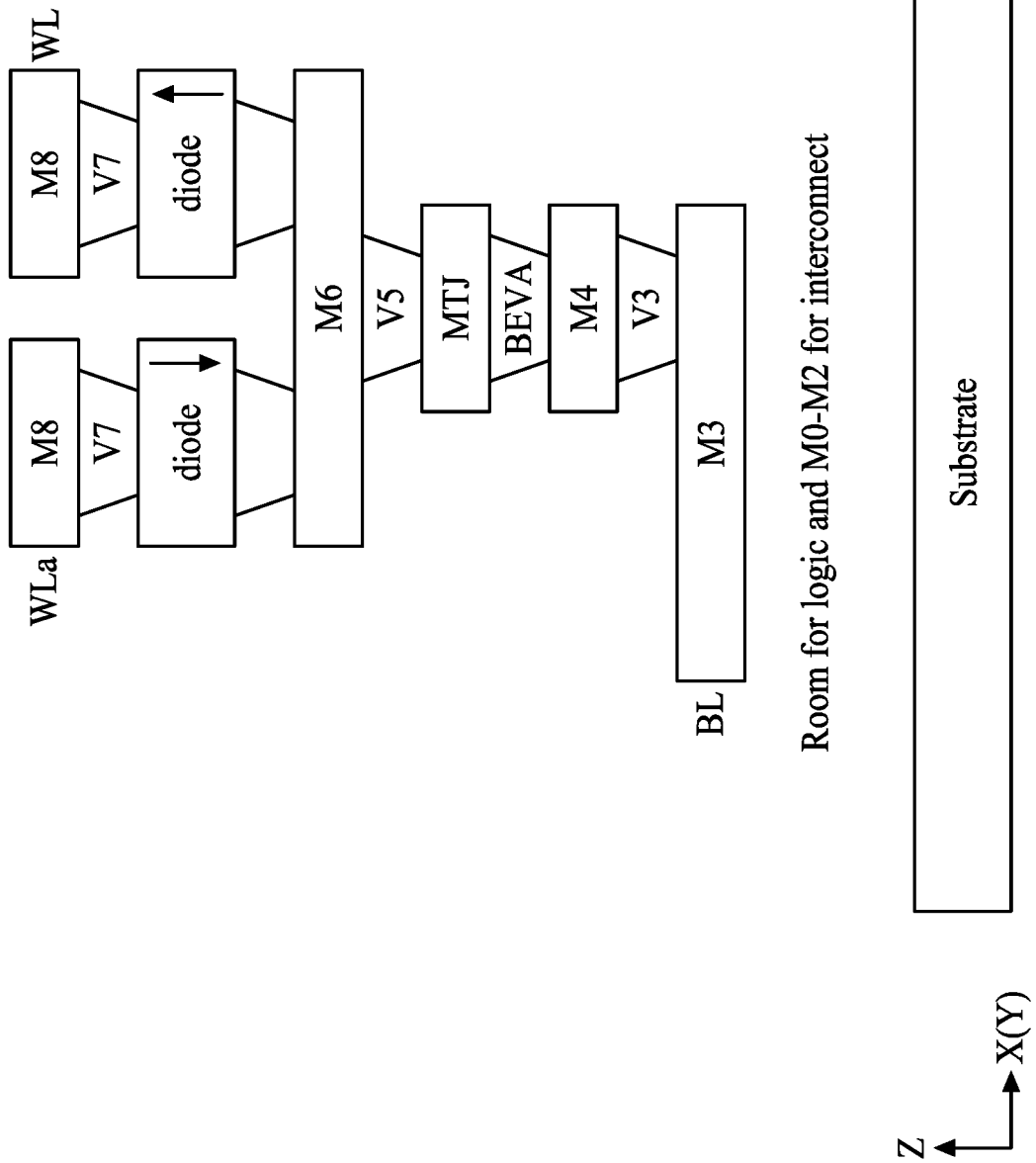
FIG. 14 show a schematic cross sectional view of the MRAM cell according to an embodiment of the present disclosure.

FIG. 14 is a schematic cross sectional view of the MRAM cell according to an embodiment of the present disclosure. In some embodiments, the MTJ film stack is disposed between M3 (or M4) layer and M6 layer, and both of the diodes are disposed above the MTJ film stack between M6 layer and M8 layer. In some embodiments, the main word line WL and associate word line WLa are disposed at the M8 layer. In some embodiments, the bit line BL is disposed at the M3 layer.

Figure 15:
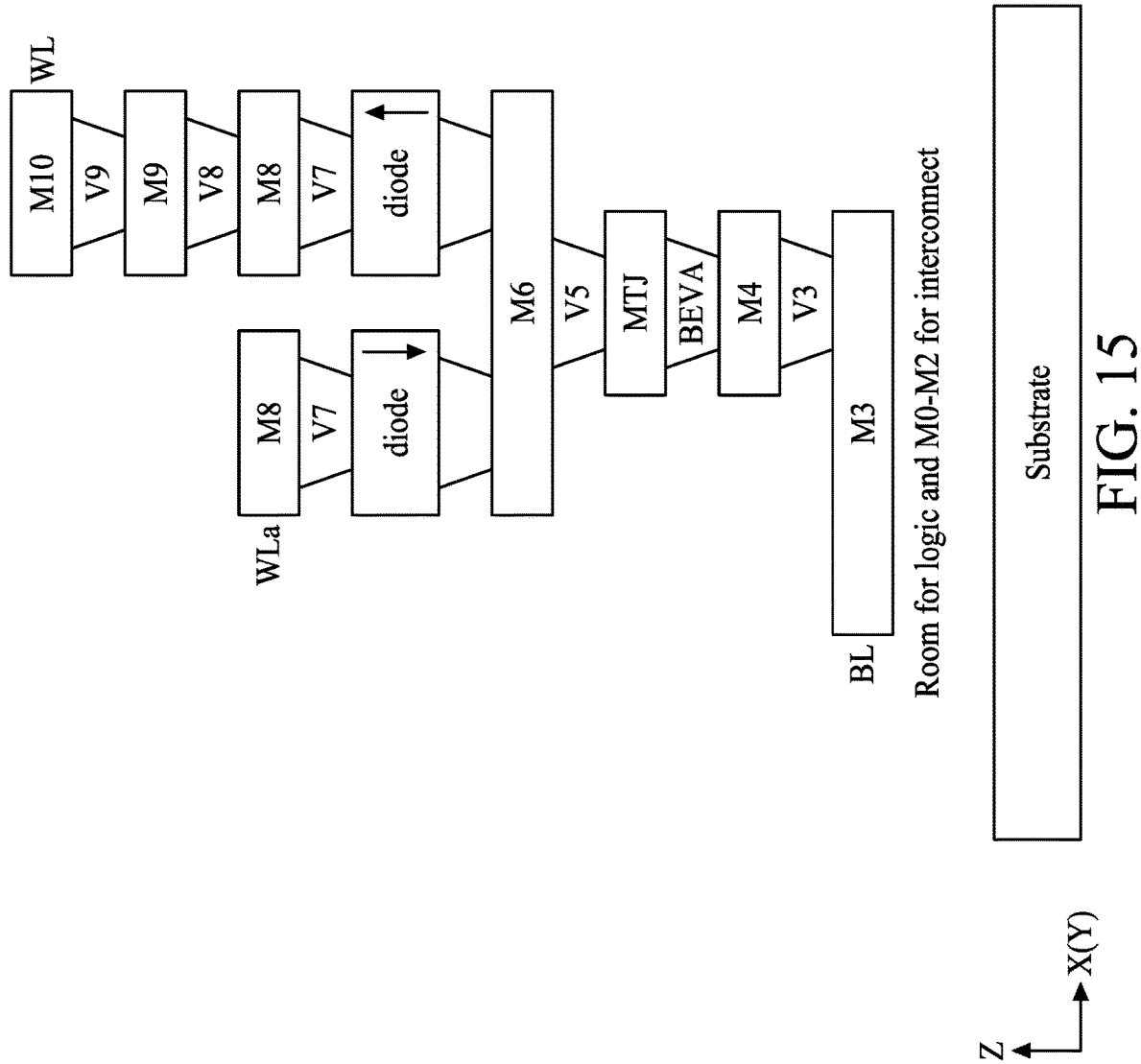
FIG. 15 show a schematic cross sectional view of the MRAM cell according to an embodiment of the present disclosure.

FIG. 15 is a schematic cross sectional view of the MRAM cell according to an embodiment of the present disclosure. In some embodiments, the MTJ film stack is disposed between M3 (or M4) layer and M6 layer, and both of the diodes are disposed above the MTJ film stack between M6 layer and M8 layer. In some embodiments, the main word line WL is disposed at M10 layer and the associate word line WLa is disposed at the M8 layer. In other embodiments, the main word line WL is disposed at M8 layer and the associate word line WLa is disposed at the M10 layer. In some embodiments, the bit line BL is disposed at the M3 layer.

Figure 16:
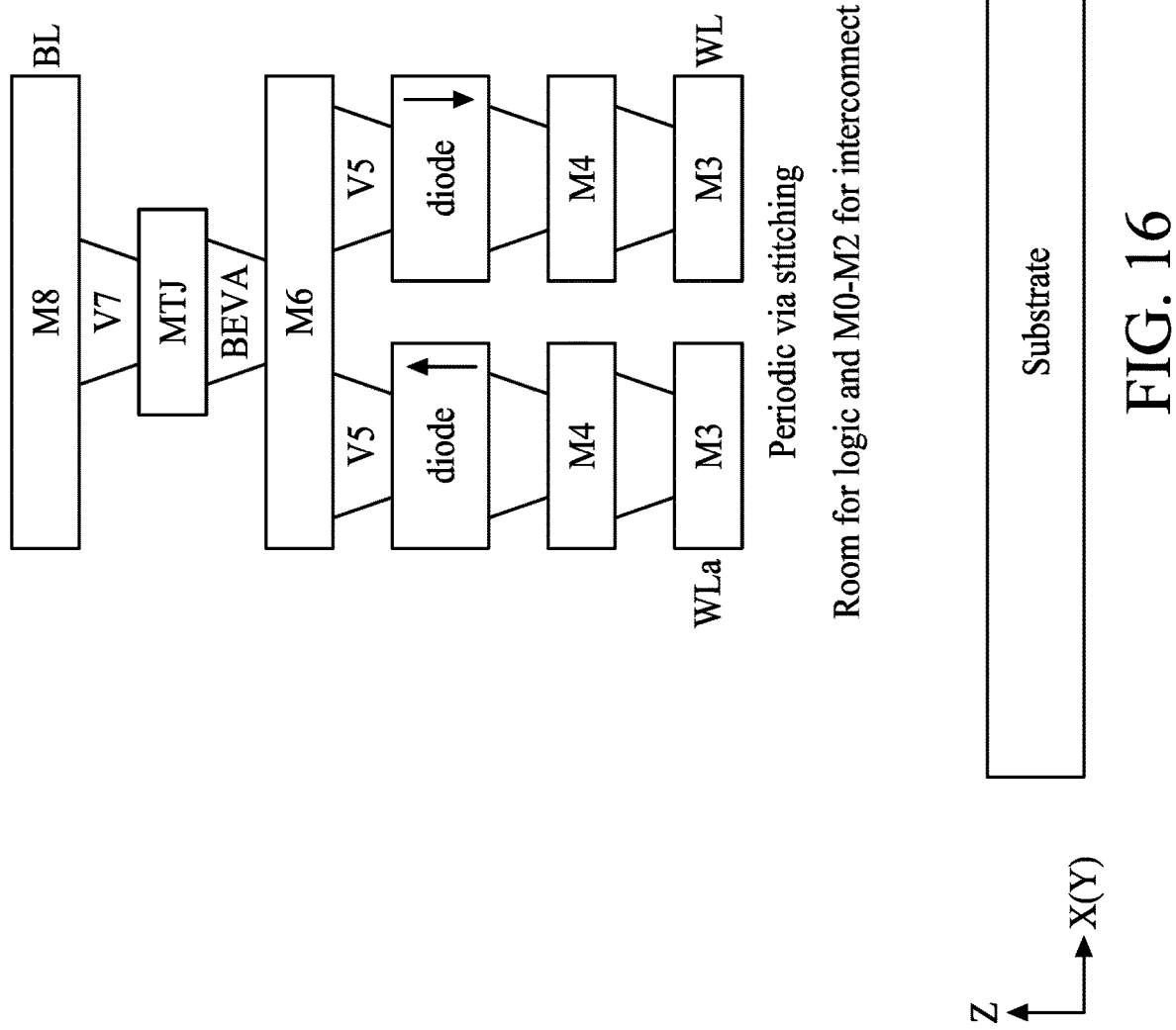
FIG. 16 show a schematic cross sectional view of the MRAM cell according to an embodiment of the present disclosure.

FIG. 16 is a schematic cross sectional view of the MRAM cell according to an embodiment of the present disclosure. In some embodiments, the MTJ film stack is disposed between M6 layer and M8 layer, and both of the diodes are disposed below the MTJ film stack between M4 (or M3) layer and M6 layer. In some embodiments, the main word line WL and associate word line WLa are disposed at the M3 layer. In some embodiments, the bit line BL is disposed at the M8 layer.

Figure 17:
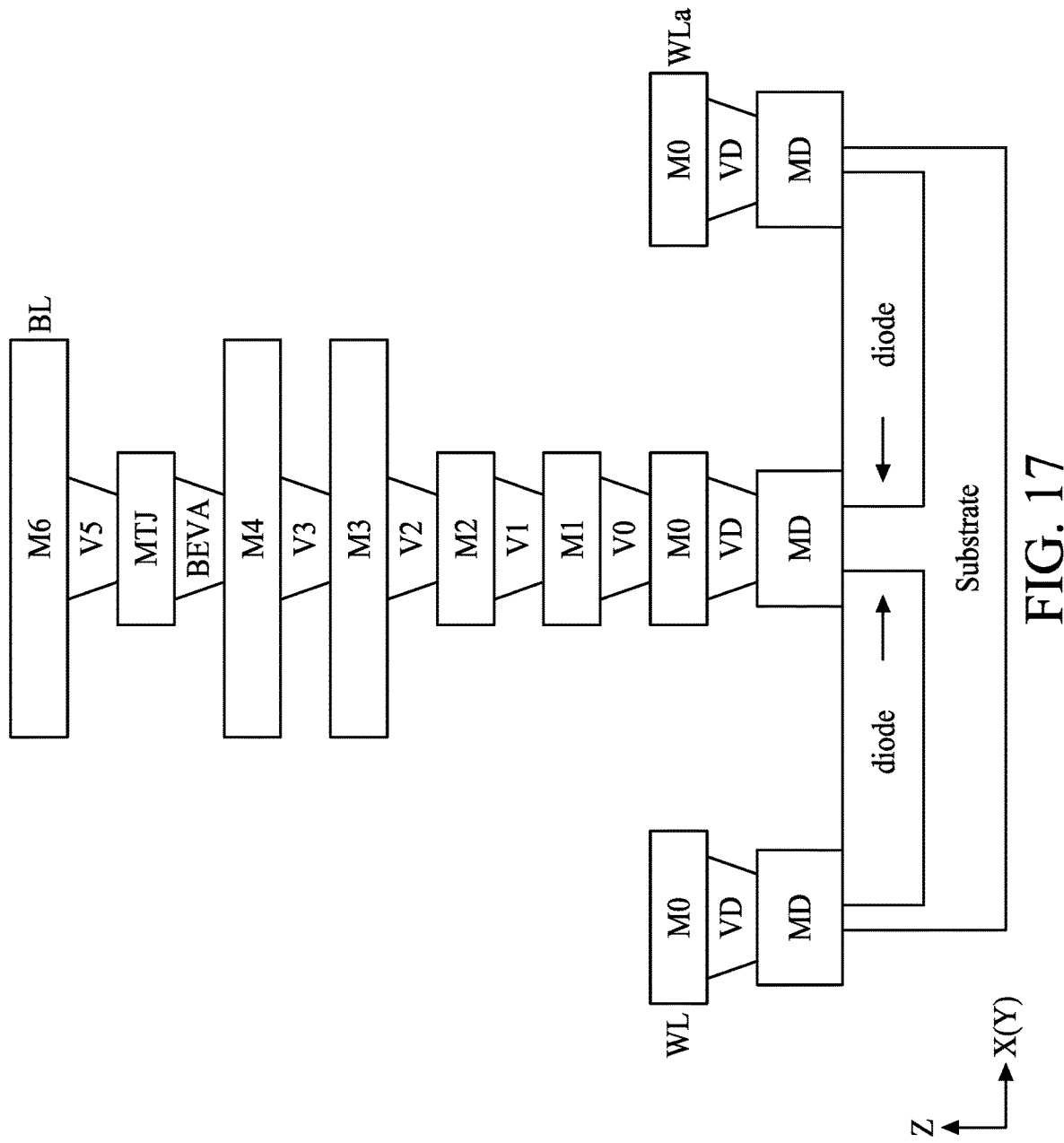
FIG. 17 show a schematic cross sectional view of the MRAM cell according to an embodiment of the present disclosure.

FIG. 17 is a schematic cross sectional view of the MRAM cell according to an embodiment of the present disclosure. In some embodiments, the MTJ film stack is disposed between M4 layer and M6 layer, and both of the diodes are disposed in the substrate. In some embodiments, the main word line WL and associate word line WLa are disposed at the M0 layer and coupled to the diodes through a via VD and a contact MD, respectively. In some embodiments, the bit line BL is disposed at the M6 layer. The M4 layer is coupled to the diodes through V3, M3, V2, M2, V1, M1, V0, M0 and MD.

Figure 18:
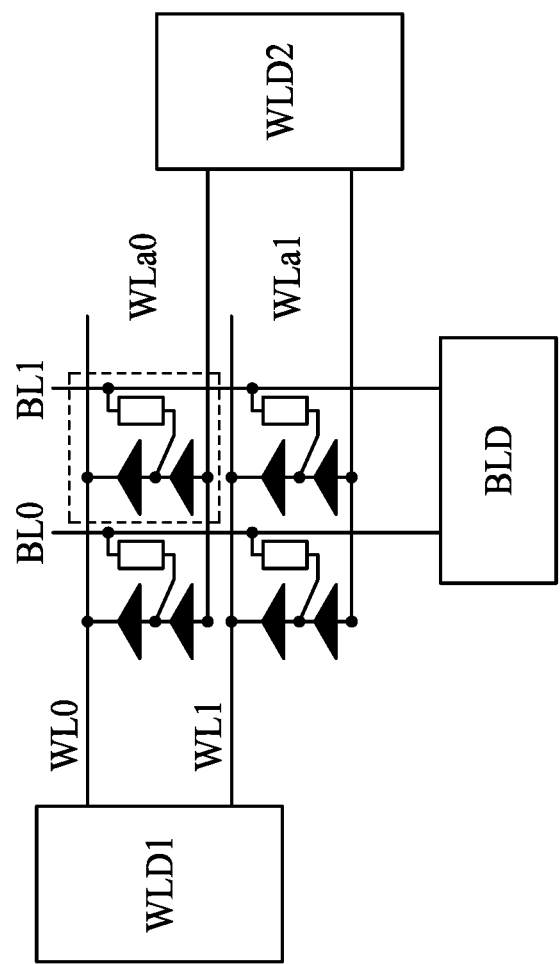
FIG. 18 shows a circuit diagram of the MRAM cell according to an embodiment of the present disclosure.

FIG. 18 shows a circuit diagram of the MRAM cell according to an embodiment of the present disclosure.

As shown in FIG. 18, a first word line driver WLD1 is coupled to main word lines WL0, WL1, . . . to apply voltages to the main word line as set forth above, and a second word line driver WLD2 is coupled to associate word lines WLa0, WLa1, . . . to apply voltages to the associate word line as set forth above. In some embodiments, one word line driver is provided for the main word lines and associate word lines, and in other embodiments, more than one first word line drivers and more than one second word line drivers are provided. Further, a bit line drive BLD1 is coupled to bit lines BL0, BL1, . . . to apply voltages to the bit line as set forth above. In some embodiments, more than one bit line drivers are provided.

In some embodiments, the diodes are a p-n diodes formed by crystalline, polycrystalline or amorphous semiconductors, or a Schottky barrier diode. In some embodiments, the diodes are a vertical junction diode or a lateral junction diode.

In the foregoing embodiments, the memory cells are MRAM cells. In other embodiments, the memory cells are PCRAM cells or RRAM cells.

It will be understood that not all advantages have been necessarily discussed herein, no particular advantage is required for all embodiments or examples, and other embodiments or examples may offer different advantages.

In accordance with one aspect of the present disclosure, a memory cell includes a memory cell stack, a first word line, a second word line, a bit line coupled to one end of the memory cell stack, a first unidirectional selector having one end coupled to another end of the memory cell stack and another end coupled to the first word line, and a second unidirectional selector having one end coupled to the another end of the memory cell stack and another end coupled to the second word line. Current flow directions of the first unidirectional selector and the second unidirectional selector are opposite to each other. In one or more of the forgoing or following embodiments, the memory cell stack includes a magnetic tunneling junction (MTJ) structure. In one or more of the forgoing or following embodiments, the bit line is coupled to a free magnetic layer side of the MTJ structure. In one or more of the forgoing or following embodiments, the memory cell stack includes a resistivity change element. In one or more of the forgoing or following embodiments, the memory cell stack includes a phase change element. In one or more of the forgoing or following embodiments, the first and second unidirectional selectors are diodes. In one or more of the forgoing or following embodiments, a cathode of the first unidirectional selector is coupled to the first word line, and an anode of the second unidirectional selector is coupled to the second word line. In one or more of the forgoing or following embodiments, one of the first and second unidirectional selectors is disposed above the memory cell stack and another of the first and second unidirectional selectors is disposed below the memory cell stack. In one or more of the forgoing or following embodiments, both of the first and second unidirectional selectors are disposed above the memory cell stack. In one or more of the forgoing or following embodiments, both of the first and second unidirectional selectors are disposed below the memory cell stack. In one or more of the forgoing or following embodiments, no transistor is connected to the memory cell stack in the memory cell.

In accordance with another aspect of the present disclosure, a semiconductor device includes memory cells, main word lines including a first main word line, associate word lines including a first associate word line, and bit lines. Each of the memory cells includes a memory cell stack, one end of which is coupled to corresponding one of the bit lines, a first diode having an anode coupled to another end of the memory cell stack and a cathode coupled to the first main word line, and a second diode having a cathode coupled to the another end of the memory cell stack and an anode coupled to the first associate word line. In one or more of the forgoing or following embodiments, the memory cell stack includes a magnetic tunneling junction (MTJ) structure. In one or more of the forgoing or following embodiments, the semiconductor device further includes a first word line driver coupled to the main word lines, a second word line driver coupled to the associate word lines, and a bit line drivers coupled to the bit lines. In one or more of the forgoing or following embodiments, to read a data from a target memory cell, the first word line driver applies a first read voltage to the first main word line coupled to the target memory cell, and applies a second read voltage to remaining main word lines other than the first main word line, the second read voltage being higher than the first read voltage, and the bit line driver applies a third read voltage to one of the bit lines coupled to the target memory cell, the third read voltage being higher than the first read voltage. In one or more of the forgoing or following embodiments, to write a first type data to a target memory cell, the first word line driver applies a first write voltage to the first main word line, the first word line driver apples a second write voltage to remaining word lines other than the first main word line, the second write voltage being higher than the first write voltage, and the bit line driver applies a third write voltage to one of the bit lines coupled to the target memory cell, the third write voltage being higher than the first write voltage, and the third write voltage being higher than the third read voltage.

In accordance with another aspect of the present disclosure, a memory device includes memory cells, main word lines, associate word lines and bit lines. Multiple cells of the memory cell are coupled to one of the main word lines and one of the associate word lines. Each of the multiple cells includes a memory cell stack, one end of which is coupled to a corresponding one of the bit lines, a first unidirectional selector having a first end coupled to another end of the memory cell stack and a second end coupled to the one of the main word lines, and a second unidirectional selector having a first end coupled to the another end of the memory cell stack and a second end coupled to the one of the associate word lines. Current flow directions of the first unidirectional selector and the second unidirectional selector are opposite to each other. In one or more of the forgoing or following embodiments, each of the memory cells includes a magnetic tunneling junction (MTJ) structure. In one or more of the forgoing or following embodiments, each of the memory cells includes a resistance change material. In one or more of the forgoing or following embodiments, each of the memory cells includes a phase change material. In one or more of the forgoing or following embodiments, in a data reading method for the memory device as set forth above, the first unidirectional selector coupled to a target memory cell from which the data is to be read is activated, and the first unidirectional selector coupled to remaining memory cells is deactivated. A read voltage is applied to one of the bit lines coupled to the target memory cell or to one of the main word lines coupled to the target memory cell. In one or more of the forgoing or following embodiments, the second unidirectional selector coupled to the memory cells is deactivated. In one or more of the forgoing or following embodiments, a data writing method for the memory device as set forth above, the first unidirectional selector coupled to each of one or more target memory cells to which the data is to be written is activated, and the first unidirectional selector coupled to remaining memory cells is deactivated. A write voltage is applied to one or more of the bit lines coupled to the one or more target memory cells or to one of the main word lines coupled to the one or more target memory cells. In one or more of the forgoing or following embodiments, the second unidirectional selector coupled to the memory cells is deactivated. In one or more of the forgoing or following embodiments, a data writing method for the memory device as set forth above, the second unidirectional selector coupled to each of one or more target memory cells to which the data is to be written is activated, and the second unidirectional selector coupled to remaining memory cells is deactivated. A write voltage is applied to one or more of the bit lines coupled to the one or more target memory cells or to one of the associate word lines coupled to the one or more target memory cells. In one or more of the forgoing or following embodiments, the first unidirectional selector coupled to the memory cells is deactivated. In one or more of the forgoing or following embodiments, a data writing method for the memory device as set forth above, the first unidirectional selector coupled to each of one or more first target memory cells to which first type data is to be written is activated, and the first unidirectional selector coupled to remaining memory cells is deactivated. The second unidirectional selector coupled to each of one or more second target memory cells to which second type data is to be written is activated, and the second unidirectional selector coupled to remaining memory cells is deactivated. A first write voltage is applied to one or more of the bit lines coupled to the one or more first target memory cells or to one of the main word lines coupled to the one or more first target memory cells, and a second write voltage is applied to one or more of the bit lines coupled to the one or more second target memory cells or to one of the associate word lines coupled to the one or more second target memory cells.

In accordance with another aspect of the present application, a method of operating a random access memory (RAM) is provide. The RAM includes memory cells, main word lines including a first main word line, associate word lines including a first associate word line, and bit lines. Each of the memory cells includes a memory cell stack, one end of which is coupled to a corresponding one of the bit lines, a first diode having an anode coupled to another end of the memory cell stack and a cathode coupled to the first main word line, and a second diode having a cathode coupled to the another end of the memory cell stack and an anode coupled to the first associate word line. In the method data is read by, applying a first read voltage to the first main word line, applying a second read voltage to remaining main word lines other than the first main word line, the second read voltage being higher than the first read voltage, and applying a third read voltage to one of the bit lines, the third read voltage being higher than the first read voltage, thereby reading the data from one of the memory cells coupled to the one of the bit lines and the first main word line. In one or more of the forgoing or following embodiments, the second read voltage is applied to the associate word lines. In one or more of the forgoing or following embodiments, first type data is written by, applying a first write voltage to the first main word line, applying a second write voltage to remaining word lines other than the first main word line, the second write voltage being higher than the first write voltage, and applying a third write voltage to one or more of the bit lines, the third write voltage being higher than the first write voltage, thereby writing the first type data to one or more of the memory cells coupled to the one or more of the bit lines and the first main word line. The third write voltage is higher than the third read voltage. In one or more of the forgoing or following embodiments, second type data is written by, applying a fourth write voltage to the first associate word line, applying a fifth write voltage to remaining associate word lines other than the first associate word line, the fifth write voltage being smaller than the fourth write voltage, and applying a sixth write voltage to one or more of the bit lines, the sixth write voltage being smaller than the fourth write voltage, thereby writing the second type data to one or more of the memory cells coupled to the one or more of the bit lines and the first associate word line. In one or more of the forgoing or following embodiments, the writing second type data further comprises applying the fourth voltage to the main word lines. In one or more of the forgoing or following embodiments, the writing second type data further comprises applying a seventh voltage higher than the fourth voltage to the main word lines. In one or more of the forgoing or following embodiments, first and second type data are written by, applying a first write voltage to the first main word line, applying a second write voltage to the first associate word line, applying a third write voltage to remaining word lines other than the first main word line, the third write voltage being higher than the first write voltage, applying a fourth write voltage to remaining associate word lines other than the first associate word line, the fourth write voltage being smaller than the third write voltage, applying a fifth write voltage to one or more of the bit lines, the fifth write voltage being higher than the first write voltage, thereby writing the first type data to one or more of the memory cells coupled to the one or more of the bit lines and the first main word line, and applying a sixth write voltage to one or more of the bit lines, the sixth write voltage being smaller than the fourth write voltage, thereby writing the second type data to one or more of the memory cells coupled to the one or more of the bit lines and the first associate word line.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating a random access memory (RAM), wherein the RAM comprises:
   memory cells;
   main word lines including a first main word line;
   associate word lines including a first associate word line; and
   bit lines, wherein:
   each of the memory cells includes:
      a memory cell stack, one end of which is coupled to a corresponding one of the bit lines;
      a first diode having an anode coupled to another end of the memory cell stack and a cathode coupled to the first main word line; and a second diode having a cathode coupled to the another end of the memory cell stack and an anode coupled to the first associate word line, the method comprising reading data by:
applying a first read voltage to the first main word line;
applying a second read voltage to remaining main word lines other than the first main word line, the second read voltage being higher than the first read voltage; and
applying a third read voltage to one of the bit lines, the third read voltage being higher than the first read voltage, thereby reading the data from one of the memory cells coupled to the one of the bit lines and the first main word line.

2. The method of claim 1, further comprising applying the second read voltage to the associate word lines.

3. The method of claim 1, further comprising writing first type data by:
applying a first write voltage to the first main word line;
applying a second write voltage to remaining word lines other than the first main word line, the second write voltage being higher than the first write voltage; and
applying a third write voltage to one or more of the bit lines, the third write voltage being higher than the first write voltage, thereby writing the first type data to one or more of the memory cells coupled to the one or more of the bit lines and the first main word line,
wherein the third write voltage is higher than the third read voltage.

4. The method of claim 3, further comprising writing second type data by:
applying a fourth write voltage to the first associate word line;
applying a fifth write voltage to remaining associate word lines other than the first associate word line, the fifth write voltage being smaller than the fourth write voltage; and applying a sixth write voltage to one or more of the bit lines, the sixth write voltage being smaller than the fourth write voltage, thereby writing the second type data to one or more of the memory cells coupled to the one or more of the bit lines and the first associate word line.

5. The method of claim 3, wherein the writing second type data further comprises applying the fourth voltage to the main word lines.

6. The method of claim 3, wherein the writing second type data further comprises applying a seventh voltage higher than the fourth voltage to the main word lines.

7. The method of claim 1, further comprising writing first and second type data by:
applying a first write voltage to the first main word line;
applying a second write voltage to the first associate word line;
applying a third write voltage to remaining word lines other than the first main word line, the third write voltage being higher than the first write voltage;
applying a fourth write voltage to remaining associate word lines other than the first associate word line, the fourth write voltage being smaller than the third write voltage;
applying a fifth write voltage to one or more of the bit lines, the fifth write voltage being higher than the first write voltage, thereby writing the first type data to one or more of the memory cells coupled to the one or more of the bit lines and the first main word line; and
applying a sixth write voltage to one or more of the bit lines, the sixth write voltage being smaller than the fourth write voltage, thereby writing the second type data to one or more of the memory cells coupled to the one or more of the bit lines and the first associate word line.

8. The method of claim 1, wherein:
the memory cell stack includes a magnetic tunneling junction (MTJ) structure, and
the one of the bit line is coupled to a free magnetic layer side of the MTJ structure.

9. The method of claim 1, wherein the memory cell stack includes a resistivity change element or a phase change element.

10. The method claim 1, wherein one of the first and second diodes is disposed above the memory cell stack and another of the first and second diodes is disposed below the memory cell stack.

11. The method of claim 1, wherein both of the first and second diodes are disposed above the memory cell stack.

12. The method of claim 1, wherein both of the first and second diodes are disposed below the memory cell stack.

13. The method of claim 1, wherein no transistor is connected to the memory cell stack in the memory cells.

14. A method of operating a random access memory (RAM), wherein the RAM comprises:
memory cells
main word lines;
associate word lines; and
bit lines, wherein:
multiple cells of the memory cell are coupled to one of the main word lines and one of the associate word lines, and
each of the multiple cells includes:
a memory cell stack, one end of which is coupled to corresponding one of the bit lines;
a first unidirectional selector having a first end coupled to another end of the memory cell stack and a second end coupled to the one of the main word line; and
a second unidirectional selector having a first end coupled to the another end of the memory cell stack and a second end coupled to the one of the associate word lines,
wherein current flow directions of the first unidirectional selector and the second unidirectional selector are opposite to each other,
the method comprising writing data by:
activating the first unidirectional selector coupled to each of one or more target memory cells to which the data is to be written, and deactivating the first unidirectional selector coupled to remaining memory cells;
applying a write voltage to one or more of the bit lines coupled to the one or more target memory cells or to one of the main word lines coupled to the one or more target memory cells.

15. The method of claim 14, further comprising, after applying the write voltage, deactivating the second unidirectional selector coupled to the memory cells.

16. The method of claim 14, the method comprising reading data:
activating the first unidirectional selector coupled to a target memory cell from which the data is to be read, and deactivating the first unidirectional selector coupled to remaining memory cell; and
applying a read voltage to one of the bit lines coupled to the target memory cell or to one of the main word lines coupled to the target memory cell.

17. The method of claim 16, further comprising, after applying the read voltage, deactivating the second unidirectional selector coupled to the memory cells.

18. A method for operating a memory device, the memory cell device comprising:
- memory cells
- main word lines;
- associate word lines; and
- bit lines, wherein:
  - multiple cells of the memory cell are coupled to one of the main word lines and one of the associate word lines, and
  - each of the multiple cells includes:
    - a memory cell stack, one end of which is coupled to corresponding one of the bit lines;
    - a first unidirectional selector having a first end coupled to another end of the memory cell stack and a second end coupled to the one of the main word line; and
    - a second unidirectional selector having a first end coupled to the another end of the memory cell stack and a second end coupled to the one of the associate word lines,
  - wherein current flow directions of the first unidirectional selector and the second unidirectional selector are opposite to each other, the method comprising writing data by:
- activating the first unidirectional selector coupled to each of one or more first target memory cells to which first type data is to be written, and deactivating the first unidirectional selector coupled to remaining memory cells;
- activating the second unidirectional selector coupled to each of one or more second target memory cells to which second type data is to be written, and deactivating the second unidirectional selector coupled to remaining memory cells;
- applying a first write voltage to one or more of the bit lines coupled to the one or more first target memory cells or to one of the main word lines coupled to the one or more first target memory cells; and
- applying a second write voltage to one or more of the bit lines coupled to the one or more second target memory cells or to one of the associate word lines coupled to the one or more second target memory cells.

19. The method of claim 18, wherein the first and second unidirectional selectors are disposed above the memory cell stack.

20. The method of claim 18, wherein at least one of first and second unidirectional selectors is disposed between M-th and (M+2)-th wiring layers, where M is 3, 4 or 6.

* * * * *